(12) United States Patent
Kim et al.

(10) Patent No.: US 9,601,171 B2
(45) Date of Patent: Mar. 21, 2017

(54) STORAGE DEVICE INCLUDING NONVOLATILE MEMORY AND MEMORY CONTROLLER AND OPERATING METHOD OF RETIMING CIRCUIT INTERFACING COMMUNICATION BETWEEN NONVOLATILE MEMORY AND MEMORY CONTROLLER

(71) Applicant: SAMSUNG ELECTRONICS CO., LTD., Suwon-si, Gyeonggi-do (KR)

(72) Inventors: Hyunjin Kim, Hwaseong-si (KR); Seonkyoo Lee, Hwaseong-si (KR); Jeongdon Ihm, Seongnam-si (KR); Youngjin Jeon, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 92 days.

(21) Appl. No.: 14/665,148

(22) Filed: Mar. 23, 2015

(65) Prior Publication Data

US 2015/0364173 A1 Dec. 17, 2015

(30) Foreign Application Priority Data

Jun. 13, 2014 (KR) ........................ 10-2014-0072170

(51) Int. Cl.
*G11C 7/00* (2006.01)
*G11C 7/22* (2006.01)
*G11C 7/10* (2006.01)
*G11C 16/06* (2006.01)
*G11C 16/32* (2006.01)

(52) U.S. Cl.
CPC ............ *G11C 7/222* (2013.01); *G11C 7/1006* (2013.01); *G11C 7/1066* (2013.01); *G11C 7/1093* (2013.01); *G11C 16/06* (2013.01); *G11C 16/32* (2013.01)

(58) Field of Classification Search
CPC ..... G11C 7/222; G11C 7/1006; G11C 7/1066; G11C 7/1093; G11C 16/06; G11C 16/32
USPC .................................... 365/191, 193, 189.03
See application file for complete search history.

(56) References Cited

U.S. PATENT DOCUMENTS

| | | | |
|---|---|---|---|
| 6,473,439 B1 * | 10/2002 | Zerbe ........................ | G06F 1/12 370/503 |
| 6,809,974 B2 | 10/2004 | Jones et al. | |
| 7,109,767 B1 | 9/2006 | Amick et al. | |
| 7,380,084 B2 * | 5/2008 | Heuchert ................ | G06F 12/06 711/154 |

(Continued)

FOREIGN PATENT DOCUMENTS

JP 2009193648 A 8/2009

*Primary Examiner* — Viet Q Nguyen
(74) *Attorney, Agent, or Firm* — Volentine & Whitt, PLLC

(57) ABSTRACT

A storage device includes a nonvolatile memory, and a memory controller adapted to control the nonvolatile memory and to transmit a first timing signal to the nonvolatile memory at a read operation. The nonvolatile memory includes a nonvolatile memory device adapted to output read data and a second timing signal in response to the first timing signal, and a retiming circuit adapted to detect a locking delay according to the first timing signal, to produce a third timing signal from the second timing signal using the detected locking delay, to retime the read data by latching the read data in synchronization with the third timing signal and to output the third timing signal and the retimed read data to the memory controller.

18 Claims, 24 Drawing Sheets

(56) References Cited

U.S. PATENT DOCUMENTS

| | | | |
|---|---|---|---|
| 7,685,454 B2 | 3/2010 | Cornelius et al. | |
| 8,059,476 B2 | 11/2011 | Ware et al. | |
| 8,121,237 B2 | 2/2012 | Stott et al. | |
| 8,151,133 B2 | 4/2012 | Kizer et al. | |
| 8,311,761 B2 | 11/2012 | Best | |
| 8,355,478 B1* | 1/2013 | Seefeldt | H03L 7/08 375/355 |
| 8,356,203 B2 | 1/2013 | Uchida et al. | |
| 8,392,741 B2 | 3/2013 | Kim et al. | |
| 8,432,768 B2* | 4/2013 | Ware | G11C 7/04 365/189.011 |
| 8,704,573 B2* | 4/2014 | Suzawa | G01R 31/31919 327/199 |
| 8,754,631 B2* | 6/2014 | Watanabe | G01R 31/31917 324/76.11 |
| 2005/0265064 A1* | 12/2005 | Ku | G06F 13/1689 365/120 |
| 2007/0288716 A1* | 12/2007 | Prete | G06F 13/1689 711/167 |
| 2011/0235459 A1* | 9/2011 | Ware | G11C 7/04 365/233.11 |
| 2012/0306893 A1* | 12/2012 | Liu | H03K 19/0002 345/501 |
| 2013/0028037 A1 | 1/2013 | Fujisawa | |
| 2013/0346785 A1* | 12/2013 | Lossin | G06F 1/12 713/401 |
| 2014/0185389 A1* | 7/2014 | Jeon | G11C 7/1093 365/189.05 |
| 2015/0310898 A1* | 10/2015 | Takefman | G11C 7/1012 711/105 |
| 2015/0357017 A1* | 12/2015 | Diffenderfer | G11C 11/4076 365/194 |
| 2016/0204782 A1* | 7/2016 | Lee | H03K 19/01754 365/189.17 |

\* cited by examiner

STORAGE DEVICE INCLUDING NONVOLATILE MEMORY AND MEMORY CONTROLLER AND OPERATING METHOD OF RETIMING CIRCUIT INTERFACING COMMUNICATION BETWEEN NONVOLATILE MEMORY AND MEMORY CONTROLLER

CROSS-REFERENCE TO RELATED APPLICATIONS

A claim for priority under 35 U.S.C. §119 is made to Korean Patent Application No. 10-2014-0072170 filed Jun. 13, 2014, in the Korean Intellectual Property Office, the entire contents of which are hereby incorporated by reference.

BACKGROUND

The present disclosure described herein relates to a semiconductor memory, and more particularly, to a storage device including a nonvolatile memory and a memory controller, and an operating method of a retiming circuit that interfaces communications between the nonvolatile memory and the memory controller.

A storage device is a device that stores data according to a control of a host device, such as a computer, a smart phone, a smart pad, and so on. The storage device may contain a device which stores data on a magnetic disk such as a Hard Disk Drive, or a device which stores data on a semiconductor memory, in particular on a nonvolatile memory, such as a Solid State Drive (SSD) or a memory card.

A nonvolatile memory may be a Read Only Memory (ROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), or a Ferroelectric RAM (FRAM).

Advancements in semiconductor fabrication technology have enabled a continued increase in the capacity of a solid state drive. As example, increase capacity may be accomplished through overlapping of semiconductor memory chips and increased integration of a semiconductor memory chip.

Generally, however, an increase in the capacity of the solid state drive hinders the reliability of a storage device. For example, the higher the number of semiconductor chips that are overlapped, the greater are certain resistance components of the overlapped chips. A toggle speed of a channel that is used to communicate with the semiconductor chips is hindered due to the increase in resistance components, thereby resulting in an increase in skew. In particular, the increase in skew may hinder the reliability of the storage device as the storage device operates at high speed.

SUMMARY

One aspect of embodiments of the present disclosure is directed to provide a storage device comprising a nonvolatile memory, and a memory controller adapted to control the nonvolatile memory and to transmit a first timing signal to the nonvolatile memory at a read operation. The nonvolatile memory may comprise a nonvolatile memory device adapted to output read data and a second timing signal in response to the first timing signal, and a retiming circuit adapted to detect a locking delay according to the first timing signal, to produce a third timing signal from the second timing signal using the detected locking delay, to retime the read data by latching the read data in synchronization with the third timing signal and to output the third timing signal and the retimed read data to the memory controller.

In exemplary embodiments, the retiming circuit may comprise a first timing reception node adapted to receive the first timing signal from the memory controller, a first timing transmission node adapted to transmit the first timing signal received through the first timing reception node to the nonvolatile memory, a second timing reception node adapted to receive the second timing signal from the nonvolatile memory, a delay locked loop adapted to detect the locking delay from the first timing signal received through the first timing reception node and to produce the third timing signal from the second timing signal received through the second timing reception node using the detected locking delay, and a second timing transmission node adapted to output to the memory controller the third timing signal output from the delay locked loop.

In exemplary embodiments, the retiming circuit may further comprise a data reception node adapted to receive the read data output from the nonvolatile memory, a flip-flop adapted to receive and output the read data received through the data reception node in synchronization with the third timing signal output from the delay locked loop, and a data transmission node adapted to output an output of the flip-flop to the memory controller as the retimed data.

In exemplary embodiments, the memory controller may be further adapted to transmit write data and a fourth timing signal to the nonvolatile memory, and the retiming circuit may be further adapted to detect a second locking delay from the fourth timing signal and to produce a fifth timing signal from the fourth timing signal using the second locking delay thus detected.

In exemplary embodiments, the retiming circuit may be further adapted to retime the write data by latching the write data in synchronization with the fifth timing signal and to output the fifth timing signal and the retimed write data to the nonvolatile memory.

In exemplary embodiments, the retiming circuit may comprise a timing reception node adapted to receive the fourth timing signal from the memory controller, a delay locked loop adapted to detect the second locking delay from the fourth timing signal received through the timing reception node and to produce the fifth timing signal from the fourth timing signal using the second locking delay thus detected, and a timing transmission node adapted to transmit the fifth timing signal output from the delay locked loop to the nonvolatile memory.

In exemplary embodiments, the retiming circuit may further include a data reception node adapted to receive the write data from the memory controller, a flip-flop adapted to receive and output the write data in synchronization with the fifth timing signal output from the delay locked loop, and a data transmission node adapted to transmit an output of the flip-flop to the nonvolatile memory as the retimed write data.

In exemplary embodiments, the retiming circuit may comprise a decoder adapted to receive a control signal from the memory controller, to determine a read or write operation of the nonvolatile memory in response to the control signal and to output an operating signal indicating the write or read operation of the nonvolatile memory, a timing signal processing unit adapted to receive the first, second and fourth timing signals from the memory controller and the nonvolatile memory and to produce the third and fifth timing signal for retiming based on the received first, second and fourth timing signals, and a data retiming unit adapted to receive the read and write data from the memory controller and the nonvolatile memory and to retime the received read and write data using the third and fifth timing signals for retiming received from the timing signal processing unit.

In exemplary embodiments, the timing signal processing unit may comprise a first timing reception node adapted to receive the first timing signal from the memory controller, a first timing transmission node adapted to transmit the first timing signal received through the first reception node to the nonvolatile memory, a second timing reception node adapted to receive the second timing signal from the nonvolatile memory, a third timing reception node adapted to receive the fourth timing signal from the memory controller, a multiplexer adapted to output the first timing signal received through the first timing reception node and the second timing signal received through the second timing reception node at a read operation and to output the fourth timing signal received through the third timing reception node at a write operation in response to the operating signal, a delay locked loop adapted to detect the locking delay from the first timing signal output from the multiplexer at a read operation, to produce the third timing signal from the second timing signal using the detected locking delay, to detect the second locking delay from the fourth timing signal output from the multiplexer at a write operation and to produce the fifth timing signal from the fourth timing signal using the second locking delay thus detected, a second timing transmission node adapted to transmit the third timing signal output from the delay locked loop to the memory controller, and a third timing transmission node adapted to transmit the fifth timing signal output from the delay locked loop to the nonvolatile memory.

In exemplary embodiments, the data retiming unit may comprise a first data reception node adapted to receive the read data from the nonvolatile memory, a first flip-flop adapted to receive and output the read data received through the first data reception node in synchronization with the third timing signal output from the delay locked loop, a first data transmission node adapted to transmit an output of the first flip-flop to the memory controller as the retimed read data, a second data reception node adapted to receive the write data from the memory controller, a second flip-flop adapted to receive and output the write data received through the second data reception node in synchronization with the fifth timing signal output from the delay locked loop, and a second data transmission node adapted to transmit an output of the second flip-flop to the nonvolatile memory as the retimed write data.

In exemplary embodiments, the timing signal processing unit may comprise a first timing reception node adapted to receive the first timing signal from the memory controller, a first timing transmission node adapted to transmit the first timing signal received through the first reception node to the nonvolatile memory, a second timing reception node adapted to receive the second timing signal from the nonvolatile memory, a third timing reception node adapted to receive the fourth timing signal from the memory controller, a first multiplexer adapted to output the first timing signal received through the first timing reception node and the second timing signal received through the second timing reception node at a read operation and to output the fourth timing signal received through the third timing reception node at a write operation in response to the operating signal, a delay locked loop adapted to detect the locking delay from the first timing signal output from the multiplexer at a read operation, to produce the third timing signal from the second timing signal using the detected locking delay, to detect the second locking delay from the fourth timing signal output from the first multiplexer at a write operation and to produce the fifth timing signal from the fourth timing signal using the second locking delay thus detected, a second multiplexer adapted to receive the third timing signal output from the delay locked loop and the second timing signal output through the second timing reception node and to output one of the third timing signal and the second timing signal in response to an activation signal, a second timing transmission node adapted to transmit an output of the second multiplexer to the memory controller, a third multiplexer adapted to receive the fifth timing signal output from the delay locked loop the fourth timing signal output through the third timing reception node and to output one of the fifth timing signal and the fourth timing signal in response to the activation signal, and a third timing transmission node adapted to transmit an output of the third multiplexer to the nonvolatile memory.

In exemplary embodiments, the data retiming unit may comprise a first data reception node adapted to receive the read data from the nonvolatile memory, a first flip-flop adapted to receive and output the read data received through the first data reception node in synchronization with the third timing signal output from the delay locked loop, a fourth multiplexer adapted to receive the read data received through the first data reception node and the retimed read data output from the first flip-flop and to output one of the read data and the retimed read data in response to the activation signal, a first data transmission node adapted to transmit an output of the fourth multiplexer to the memory controller, a second data reception node adapted to receive the write data from the memory controller, a second flip-flop adapted to receive and output the write data received through the second data reception node in synchronization with the fifth timing signal output from the delay locked loop, a fifth multiplexer adapted to receive the write data received through the second data reception node and the retimed write data output from the second flip-flop and to output one of the write data and the retimed write data in response to the activation signal, and a second data transmission node adapted to transmit an output of the fifth multiplexer to the nonvolatile memory.

In exemplary embodiments, the fifth timing signal may be a signal that is delayed from the fourth timing signal as much as a quarter period, and the retimed write data may be delayed from the write data as much as a quarter period of the fourth timing signal.

In exemplary embodiments, and the fifth timing signal may be a data strobe signal that is toggled by the memory controller at a write operation of the nonvolatile memory.

In exemplary embodiments, the first timing signal may be a read enable signal that is toggled by the memory controller at a read operation of the nonvolatile memory, and the second timing signal may be a data strobe signal that the nonvolatile memory produces on the basis of the read enable signal.

In exemplary embodiments, the third timing signal may be a signal that is delayed from the second timing signal as much as a quarter period, and the retimed read data may be delayed from the read data as much as a quarter period of the third timing signal.

In exemplary embodiments, the nonvolatile memory may include a plurality of nonvolatile memory devices, and the plurality of nonvolatile memory devices may be connected to the retiming circuit in common.

In exemplary embodiments, the plurality of nonvolatile memory devices may exchange the first timing signal and the third timing signal with the retiming circuit via a common shared channel, and may exchange the read data with the retiming circuit via at least two channels.

In exemplary embodiments, the locking delay may be detected during the first timing signal toggles two times.

One aspect of embodiments of the present disclosure is directed to provide an operating method of a retiming circuit that interfaces communications between a nonvolatile memory and a memory controller. The operating method may comprise receiving a first timing signal from the memory controller, detecting a locking delay from the first timing signal, receiving data and a second timing signal from the nonvolatile memory, producing a third timing signal using the detected locking delay and the second timing signal, and retiming the data by latching the data using the third timing signal.

With embodiments of the present disclosure, data may be retimed such that retiming is overlapped with normal operations of a storage device. Thus, the reliability of the storage device may be improved without hindering operating performance.

BRIEF DESCRIPTION OF THE FIGURES

The above and other objects and features will become apparent from the following description with reference to the following figures, wherein similar reference numerals refer to similar parts throughout the various figures unless otherwise specified, and wherein.

DETAILED DESCRIPTION

Figure 1:
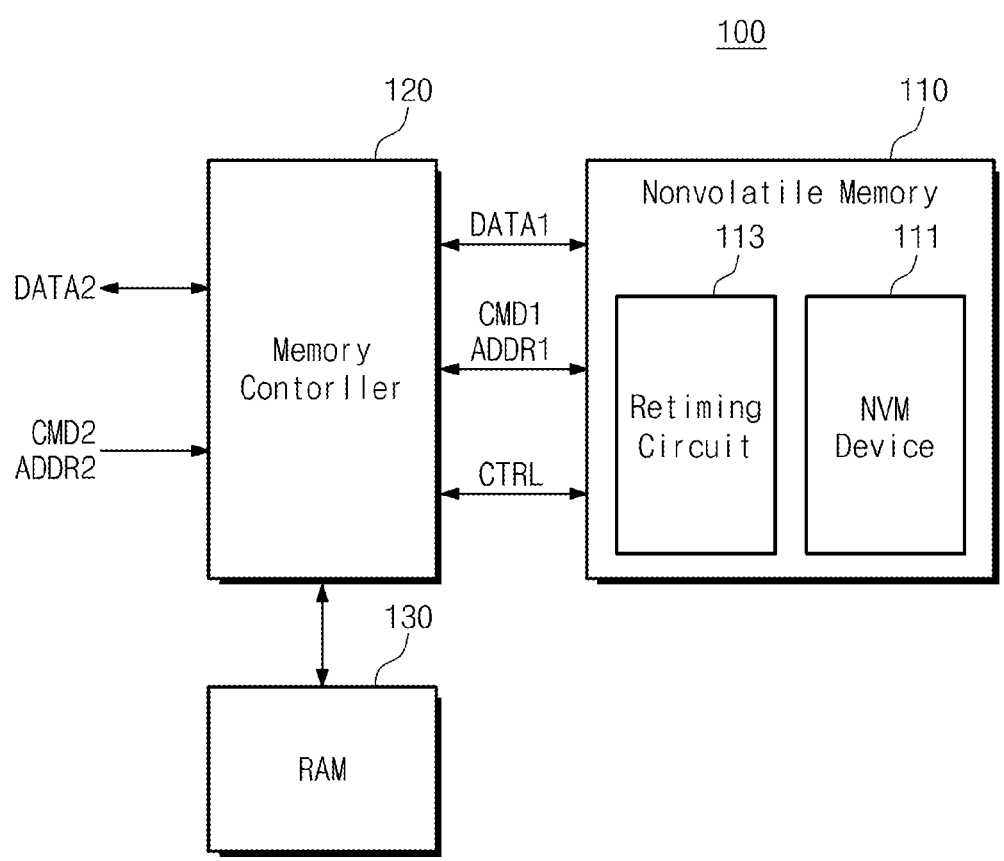
FIG. 1 is a block diagram schematically illustrating a storage device according to an embodiment of the present disclosure.

Embodiments will be described in detail with reference to the accompanying drawings. The present disclosure, however, may be embodied in various different forms, and should not be construed as being limited only to the illustrated embodiments. Rather, these embodiments are provided as examples so that this disclosure will be thorough and complete, and will fully convey the concept of the present disclosure to those skilled in the art. Accordingly, known processes, elements, and techniques are not described with respect to some of the embodiments of the present disclosure. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating a storage device 100 according to an embodiment of the present disclosure. Referring to FIG. 1, a storage device 100 may contain a nonvolatile memory 110, a memory controller 120, and a random access memory (RAM) 130.

The nonvolatile memory 110 may perform read, write, and erase operations according to a control of the memory controller 120. The nonvolatile memory 110 may exchange first data DATA1 with the memory controller 120. For example, the nonvolatile memory 110 may receive write data from the memory controller 120 and may store the write data. The nonvolatile memory 110 may perform the read operation and may output the read data to the memory controller 120.

The nonvolatile memory 110 may receive a first command CMD1 and a first address ADDR1 from the memory controller 120. The nonvolatile memory 110 may exchange a control signal CTRL with the memory controller 120. For example, the nonvolatile memory 110 may receive, from the memory controller 120, at least one of a chip enable signal /CE for selecting at least one of a plurality of semiconductor devices constituting the nonvolatile memory 110, a command latch enable signal CLE indicating that a signal received from the memory controller 120 is the first command CMD1, an address latch enable signal ALE indicating that a signal received from the memory controller 120 is the first address ADDR1, a read enable signal /RE that is received from the memory controller 120 at a read operation, is periodically toggled and is used to tune timing, a write enable signal /WE activated by the memory controller 120 when the first command CMD1 or the first address ADDR1 is transmitted, a write protection signal /WP activated by the memory controller 120 to prevent unintended writing or erasing when a power changes, and a data strobe signal DQS that is used to adjust input synchronization about the first data DATA1 and is generated from the memory controller 120 at a write operation so as to be periodically toggled. For example, the nonvolatile memory 110 may output, to the memory controller 120, at least one of a ready/busy signal R/nB indicating whether the nonvolatile memory 110 is performing a program, erase or read operation and a data strobe signal DQS that is used to adjust output synchronization about the first data DATA1 and is generated from the read enable signal /RE by the nonvolatile memory 110 so as to be periodically toggled.

The nonvolatile memory 110 may contain a nonvolatile memory device 111 and a retiming circuit 113. The nonvolatile memory device 111 may communicate with the memory controller 120 through the retiming circuit 113. The retiming circuit 113 may interface communications between the nonvolatile memory 111 and the memory controller 120. The retiming circuit 113 may retime data that is exchanged between the memory controller 120 and the nonvolatile memory 111. Retiming may include buffering in which transmitted data is stored and output. If transmitted data is stored and output, its timing may be adjusted, thereby making skew reduced. That is, the retiming circuit 113 may rearrange data exchanged between the nonvolatile memory 111 and the memory controller 120, thereby improving the reliability of the storage device 100.

The nonvolatile memory 110 may include a flash memory. However, the present disclosure is not limited thereto. For example, the nonvolatile memory 110 may incorporate at least one of nonvolatile memories, such as a Phase-change RAM (PRAM), a Magnetic RAM (MRAM), a Resistive RAM (RRAM), a Ferroelectric RAM (FRAM), and so on.

The memory controller 120 may be configured to control the nonvolatile memory 110. For example, the nonvolatile memory 110 may perform a write, read, or erase operation according to a control of the memory controller 120. The memory controller 120 may exchange the first data DATA1 and the control signal CTRL with the nonvolatile memory 110 and may output the first command CMD1 and the first address ADDR1 to the nonvolatile memory 110.

The memory controller 120 may control the nonvolatile memory 110 according to a control of an external host device (not shown). The memory controller 120 may exchange second data DATA2 with the host device and may receive a second command CMD2 and a second address ADDR2 therefrom.

In exemplary embodiments, the memory controller 120 may exchange the first data DATA1 with the nonvolatile memory 110 by a first unit, and the memory controller 120 may exchange the second data DATA2 with the host device by a second unit different from the first unit.

Based on a first format, the memory controller 120 may exchange the first data DATA1 with the nonvolatile memory 110 and may transmit the first command CMD1 and the first address ADDR1 to the nonvolatile memory 110. Based on a second format different from the first format, the memory controller 120 may exchange the second data DATA2 with the host device and may receive the second command CMD2 and the second address ADDR2 from the host device.

The memory controller 120 may use the RAM 130 as a working memory, a buffer memory, or a cache memory. For example, the memory controller 120 may receive the second data DATA2 from the host device and may store the second data DATA2 in the RAM 130. The memory controller 120 may write the second data DATA2 stored in the RAM 130 at the nonvolatile memory 110 as the first data DATA1. The memory controller 120 may read the first data DATA1 from the nonvolatile memory 110 and may store the first data DATA1 thus read in the RAM 130. The memory controller 120 may output the first data DATA1 stored in the RAM 130 to the host device as the second data DATA2. The memory controller 120 may store data read from the nonvolatile memory 110 at the RAM 130 and may write the data stored in the RAM 130 back at the nonvolatile memory 110.

The memory controller 120 may store data or codes, needed to manage the nonvolatile memory 110, at the RAM 130. For example, the memory controller 120 may read data or codes, needed to manage the nonvolatile memory 110, from the nonvolatile memory 110, and may load the read data or codes on the RAM 130 for driving.

The RAM 130 may include at least one of a variety of random access memories, such as, but not limited to, a static RAM (SRAM), a dynamic RAM (DRAM), a synchronous DRAM (SDRAM), a Phase-change RAM (PRAM), a Magnetic RAM (MRAM), a Resistive RAM (RRAM), a Ferroelectric RAM (FRAM), and so on.

The storage device 100 may perform an operation of writing, reading or erasing data according to a request of the host device. The storage device 100 may include a solid state drive (SSD) or a hard disk drive (HDD). The storage device 100 may include memory cards, such as a personal computer memory card international association (PCMCIA), a compact flash card, a smart media card (SMC), a memory stick, a multimedia card (MMC), a secure digital (SD) card, a Universal Serial Bus (USB) memory card, a universal flash storage (UFS), and so on. The storage device 100 may include embedded memories, such as an embedded MultiMedia Card (eMMC), a UFS, a Perfect Page New (PPN), and so on.

Figure 2:
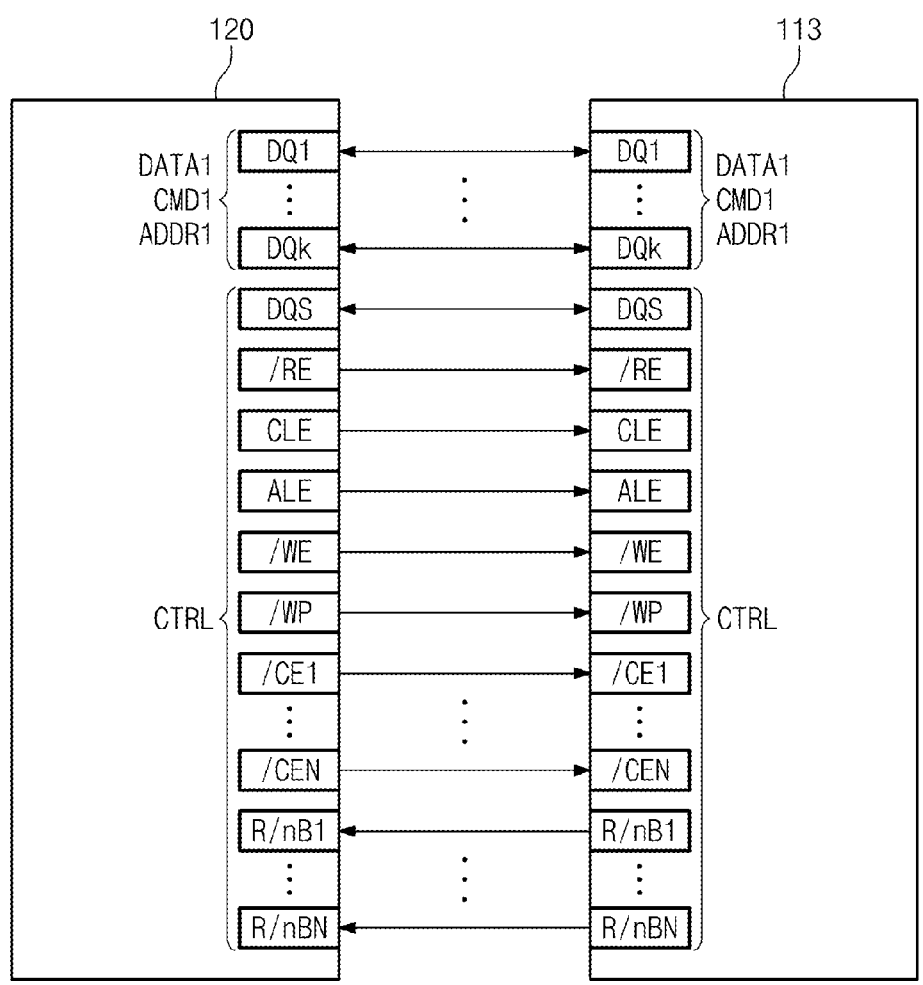
FIG. 2 is a block diagram schematically illustrating an example of an interconnection between a memory controller and a retiming circuit.

FIG. 2 is a block diagram schematically illustrating an example of an interconnection between a memory controller 120 and a retiming circuit 113. Referring to FIG. 2, first data DATA1, a first command CMD1, and a first address ADDR1 may be exchanged between a memory controller 120 and a retiming circuit 113 through a common channel. Each of the memory controller 120 and the retiming circuit 130 may contain a plurality of input/output pads DQ1 through DQk. The first data DATA1, the first command CMD1, and the first address ADDR1 may be exchanged between the memory controller 120 and the retiming circuit 113 through the plurality of input/output pads DQ1 through DQk. For example, signals that are transmitted through the plurality of input/output pads DQ1 through DQk may be identified as the first data DATA1, first command CMD1, or first address ADDR1 according to a shape of a control signal CTRL. For example, the number of the plurality of input/output pads DQ1 through DQk may be 8, 16, or 32. However, the present disclosure is not limited thereto.

The control signal CTRL may be exchanged between the memory controller 120 and the retiming circuit 113. Each of the memory controller 120 and the retiming circuit 113 may contain pads for transmitting or receiving a data strobe signal DQS, a read enable signal /RE, a command latch enable signal CLE, an address latch enable signal ALE, a write enable signal /WE, a write protection signal /WP, and chip enable signals /CE1 through /CEN, and ready/busy signals R/nB1 through R/nBN.

For example, when the memory controller 120 activates one of the chip enable signals /CE1 through /CEN (e.g., logical low level), activates the command latch enable signal CLE (e.g., logical high level), inactivates the address latch enable signal ALE (e.g., logical low level), and makes the write enable signal /WE transit from activation (e.g., logical low level) to inactivation (e.g., logical high level) (i.e., inactivates the write enable signal /WE after activating the write enable signal /WE), the memory controller 120 may output a first command CMD1 through the plurality of input/output pads DQ1 through DQk. Also, the retiming circuit 113 or a nonvolatile memory device 111 may recognize that the first command CMD1 is received through the plurality of input/output pads DQ1 through DQk.

For example, when activating one of the chip enable signals /CE1 through /CEN (e.g., logical low level), inactivating the command latch enable signal CLE (e.g., logical low level), activating the address latch enable signal ALE (e.g., logical high level), and making the write enable signal /WE transit from activation (e.g., logical low level) to inactivation (e.g., logical high level) (i.e., inactivating the write enable signal /WE after activating the write enable signal /WE), the memory controller 120 may output a first address ADDR1 through the plurality of input/output pads DQ1 through DQk. Also, the retiming circuit 113 or the nonvolatile memory device 111 may recognize that the first address ADDR1 is received through the plurality of input/output pads DQ1 through DQk.

For example, when activating one of the chip enable signals /CE1 through /CEN (e.g., logical low level), inactivating the command latch enable signal CLE (e.g., logical low level), inactivating the address latch enable signal ALE (e.g., logical low level), inactivating the write enable signal /WE (e.g., logical high level), and inactivating the read enable signal /RE (e.g., logical high level), the memory controller 120 may produce the data strobe signal DQS periodically toggled and may output first data DATA1 through the plurality of input/output pads DQ1 through DQk in synchronization with the data strobe signal DQS. Also, the retiming circuit 113 or the nonvolatile memory device 111 may recognize that the first data DATA1 is received through the plurality of input/output pads DQ1 through DQk in synchronization with the data strobe signal DQS.

For example, the memory controller 120 may activate one of the chip enable signals /CE1 through /CEN (e.g., logical low level), may inactivate the command latch enable signal CLE (e.g., logical low level), may inactivate the address latch enable signal ALE (e.g., logical low level), may inactivate the write enable signal /WE (e.g., logical high level), and may make the read enable signal /RE periodically toggled. The retiming circuit 113 or the nonvolatile memory device 111 may produce the data strobe signal DQS periodically toggled, based on the read enable signal /RE that is periodically toggled. The retiming circuit 113 or the nonvolatile memory device 111 may output the first data DATA1 through the plurality of input/output pads DQ1 through DQk in synchronization with the data strobe signal DQS. The memory controller 120 may recognize that the first data DATA1 is received through the plurality of input/output pads DQ1 through DQk in synchronization with the data strobe signal DQS.

Figure 3:
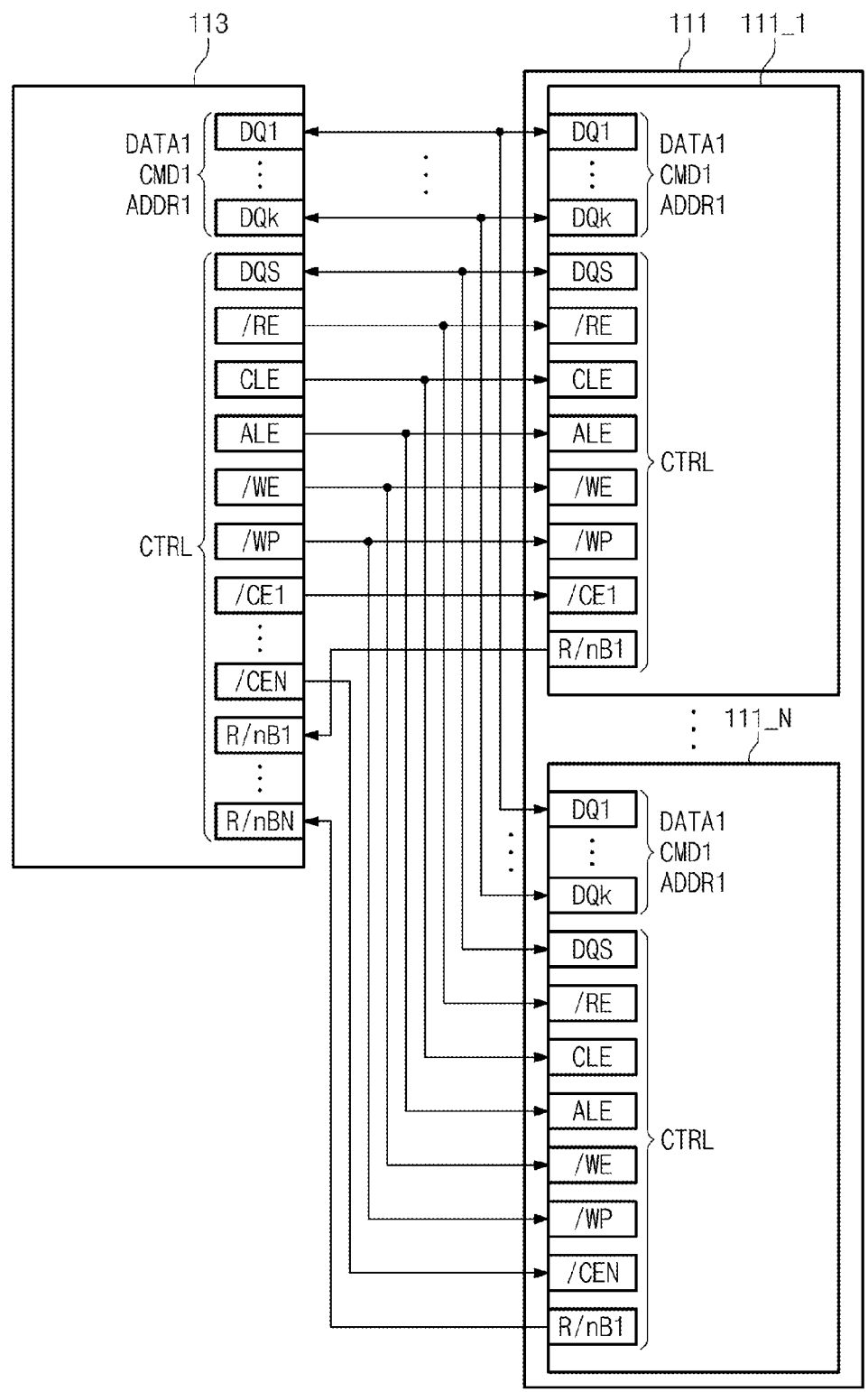
FIG. 3 is a block diagram schematically illustrating an example of an interconnection between a retiming circuit and a nonvolatile memory device.

FIG. 3 is a block diagram schematically illustrating an example of an interconnection between a retiming circuit 113 and a nonvolatile memory device. Referring to FIG. 3, a nonvolatile memory device 111 may contain a plurality of nonvolatile memory devices 111_1 through 111_N. For example, each of the plurality of nonvolatile memory devices 111_1 through 111_N may be formed of a semiconductor chip.

Each of the retiming circuit 113 and the plurality of nonvolatile memory devices 111_1 through 111_N may contain a plurality of input/output pads DQ1 through DQk. The plurality of input/output pads DQ1 through DQk of the retiming circuit 113 may be connected to the plurality of input/output pads DQ1 through DQk of each of the plurality of nonvolatile memory devices 111_1 through 111_N. Between the retiming circuit 113 and the plurality of nonvolatile memory devices 111_1 through 111_N, first data DATA1, a first command CMD1, and a first address ADDR1 may be exchanged through the plurality of input/output pads DQ1 through DQk. For example, signals that are transmitted through the plurality of input/output pads DQ1 through DQk may be identified as the first data DATA1, first command CMD1, or first address ADDR1 according to a shape of the control signal CTRL. For example, the number of the plurality of input/output pads DQ1 through DQk may be 8, 16, or 32. However, the present disclosure is not limited thereto.

The control signal CTRL may be exchanged between the retiming circuit 113 and the plurality of nonvolatile memory devices 111_1 through 111_N. The retiming circuit 113 may contain pads for transmitting or receiving a data strobe signal DQS, a read enable signal /RE, a command latch enable signal CLE, an address latch enable signal ALE, a write enable signal /WE, a write protection signal /WP, chip enable signals /CE1 through /CEN, and ready/busy signals R/nB1 through R/nBN.

Each of the plurality of nonvolatile memory devices 111_1 through 111_N may contain a pad for transmitting or receiving the data strobe signal DQS, the read enable signal /RE, the command latch enable signal CLE, the address latch enable signal ALE, the write enable signal /WE, the write protection signal /WP, one of the chip enable signals /CE1 through /CEN, and one of the ready/busy signals R/nB1 through R/nBN.

The plurality of nonvolatile memory devices 111_1 through 111_N may exchange the data strobe signal DQS, the read enable signal /RE, the command latch enable signal CLE, the address latch enable signal ALE, the write enable signal /WE, and the write protection signal /WP with the retiming circuit 113 through a common channel.

Each of the plurality of nonvolatile memory devices 111_1 through 111_N may receive a chip enable signal from the retiming circuit 113 and may output a ready/busy signal to the retiming circuit 113. The plurality of nonvolatile memory devices 111_1 through 111_N may receive the chip enable signals /CE1 through /CEN from different pads of the retiming circuit 113. The plurality of nonvolatile memory devices 111_1 through 111_N may transmit the ready/busy signals R/nB1 through R/nBN to different pads of the retiming circuit 113.

As described with reference to FIGS. 2 and 3, the retiming circuit 113 may interface communications between the memory controller 120 and the plurality of nonvolatile memory devices 111_1 through 111_N. The retiming circuit 113 may rearrange the first data DATA1 received from the memory controller 120 and may transfer the rearranged result to the plurality of nonvolatile memory devices 111_1 through 111_N. The retiming circuit 113 may rearrange the first data DATA1 received from the plurality of nonvolatile memory devices 111_1 through 111_N, and may output the rearranged result to the memory controller 120. Retiming of the retiming circuit 113 may be made as being shadowed during communications between the memory controller 120 and the plurality of nonvolatile memory devices 111_1 through 111_N. Thus, the retiming circuit may improve the reliability of the storage device 100 without hindering an operating speed of the storage device 100.

Figure 4:
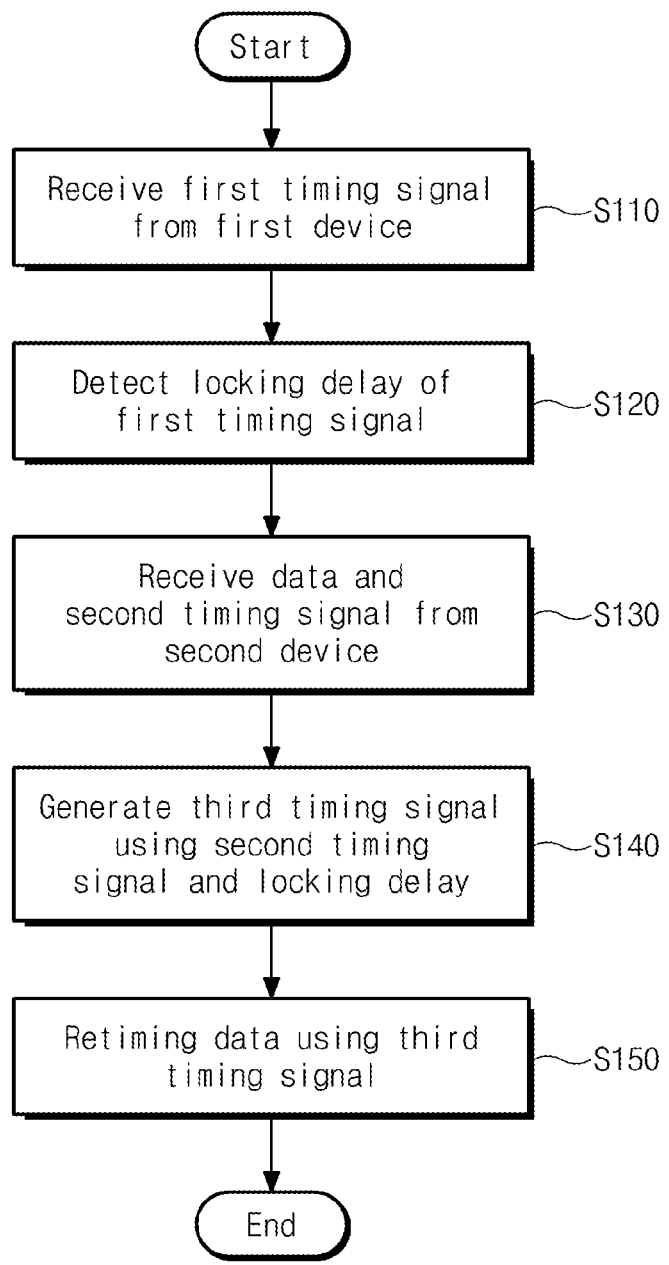
FIG. 4 is a flow chart schematically illustrating an operating method of a retiming circuit according to an embodiment of the present disclosure.

FIG. 4 is a flow chart schematically illustrating an operating method of a retiming circuit 113 according to an embodiment of the present disclosure. Referring to FIGS. 1 through 4, in step S110, a retiming circuit 113 may receive a first timing signal from a first device. For example, the retiming circuit 113 may receive the first timing signal from a memory controller 120. The first timing signal may be a signal that is periodically toggled and provides synchronization. For example, the first timing signal may be a read enable signal /RE that is periodically toggled at a read operation and provides synchronization.

In step S120, the retiming circuit 113 may detect a locking delay of the first timing signal. For example, the retiming circuit 113 may be synchronized with the first timing signal using a delay locked loop (DLL). The retiming circuit 113 may detect a delay of the delay locked loop as the locking delay when synchronized with the first timing signal according to a predetermined method.

In step S130, the retiming circuit 113 may receive data and a second timing signal from a second device. For example, the retiming circuit 113 may receive the data and the second timing signal from a nonvolatile memory device 111. The received data may be data that is read out from the nonvolatile memory device 111 at a read operation. The second timing signal may be a signal that is periodically toggled and provides synchronization. For example, the second timing signal may be a data strobe signal DQS that is provided from the nonvolatile memory device 111 at a read operation and is periodically toggled.

In step S140, the retiming circuit 113 may generate a third timing signal using the second timing signal and the locking delay. For example, the retiming circuit 113 may delay the data strobe signal DQS from the nonvolatile memory device 111 as much as the locking delay that is detected from the read enable signal /RE using the delay locked loop DLL. The retiming circuit 113 may generate, as the third timing signal, a signal obtained by delaying the data strobe signal DQS.

In step S150, the retiming circuit 113 may retime data using the third timing signal. For example, the retiming circuit 113 may latch the data from the nonvolatile memory device 111 in synchronization with the third timing signal. The retiming circuit 113 may output the latched data to the memory controller 120 together with the third timing signal. The third timing signal may be output as the data strobe signal DQS. That is, the retiming circuit 113 may rearrange the data read from the nonvolatile memory device 111, in synchronization with the third timing signal. An operation in which the retiming circuit 113 rearranges read data may be overlapped with normal operations of a storage device 100. Thus, the retiming circuit 113 may improve the reliability of the storage device 100 without hindering an operating performance of the storage device 100.

Figure 5:
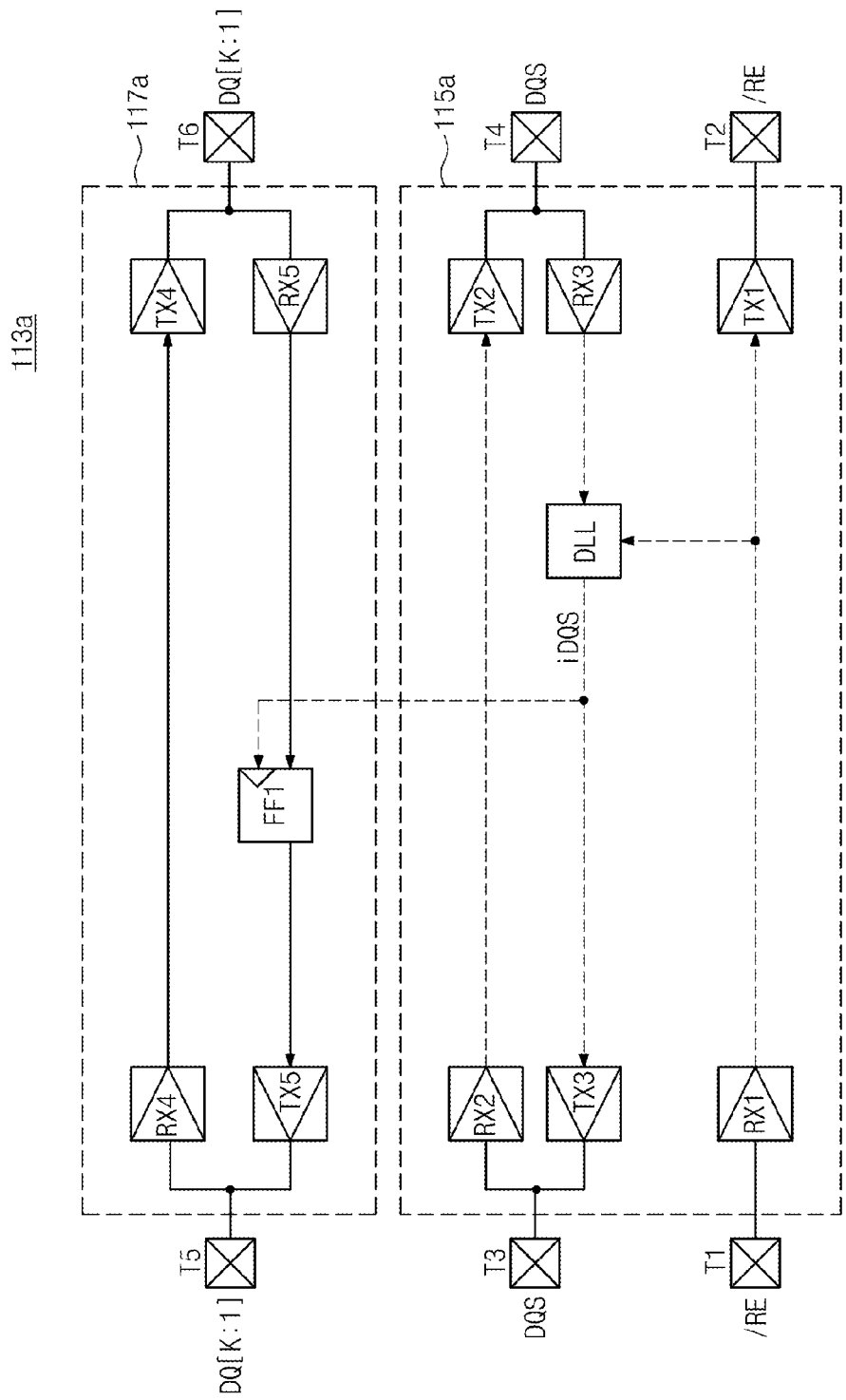
FIG. 5 shows a retiming circuit according to an embodiment of the present disclosure.

FIG. 5 shows a retiming circuit 113a according to an embodiment of the present disclosure. Referring to FIGS. 2, 3, and 5, a retiming circuit 113a may contain a timing signal processing unit 115a and a data retiming unit 117a.

The timing signal processing unit 115a may receive a read enable signal /RE from a memory controller 120 through a first terminal T1. The first terminal T1 may correspond to a pad of a retiming circuit 113 through which a read enable signal /RE is received (refer to FIG. 2). The timing signal processing unit 115a may output the read enable signal /RE to a nonvolatile memory device 111 through a second terminal T2. The second terminal T2 may correspond to a pad of the retiming circuit 113 through which the read enable signal /RE is output (refer to FIG. 3).

The timing signal processing unit 115a may exchanges a data strobe signal DQS with the memory controller 120 through a third terminal T3. The third terminal T3 may correspond to a pad of the retiming circuit 113 through which the data strobe signal DQS is exchanged (refer to FIG. 2). The timing signal processing unit 115a may exchange the data strobe signal DQS with the nonvolatile memory device 111 through a fourth terminal T4. The fourth terminal T4 may correspond to a pad of the retiming circuit 113 through which the data strobe signal DQS is exchanged (refer to FIG. 3).

The timing signal processing unit 115a may have first through third reception nodes RX1 through RX3, first through third transmission nodes TX1 through TX3, and a delay locked loop DLL.

The first reception node RX1 may receive the read enable signal /RE through the first terminal T1. The read enable signal /RE received through the first reception node RX1 may be transferred to the second terminal T2 through the first transmission node TX1. For example, at a read operation of the nonvolatile memory 110, the read enable signal /RE may be transmitted from the first terminal T1 to the second terminal T2 through the first reception node RX1 and the first transmission node TX1. The read enable signal /RE may be also transmitted from the first reception node RX1 to the delay locked loop DLL.

The second reception node RX2 may receive the data strobe signal DQS through the third terminal T3. The data strobe signal DQS received through the third reception node RX3 may be sent to the fourth terminal T4 through the second transmission node TX2. For example, at a write operation, the data strobe signal DQS may be transmitted from the third terminal T3 to the fourth terminal T4 through the second reception node RX2 and the second transmission node TX2.

The third reception node RX3 may receive the data strobe signal DQS through the fourth terminal T4. The data strobe signal DQS received through the third reception node RX3 may be sent to the delay locked loop DLL.

The delay locked loop DLL may receive the read enable signal /RE through the first reception node RX1 and the data strobe signal DQS through the third reception node RX3. The delay locked loop DLL may detect a locking delay in synchronization with the read enable signal /RE. The delay locked loop DLL may produce an internal signal iDQS by delaying the data strobe signal DQS received through the third reception node RX3 as much as the detected locking delay. The internal signal iDQS may be sent to the third terminal T3 through the third transmission node TX3 as the data strobe signal DQS. Also, the internal signal iDQS may be transferred to the data retiming unit 117a.

The data retiming unit 117a may receive a first address ADDR1 or a first command CMD1 from the memory controller 120 through a fifth terminal T5. First data DATA1 may be exchanged between the data retiming unit 117a and the memory controller 120 through the fifth terminal T5. The fifth terminal T5 may correspond to input/output pads DQ1 through DQk of a retiming circuit 113 shown in FIG. 2. The data retiming unit 117a may output the first address ADDR1 or the first command CMD1 to the nonvolatile memory device 111 through a sixth terminal T6. The data retiming unit 117a may exchange the first data DATA1 with the memory controller 120 through the sixth terminal T6. The sixth terminal T6 may correspond to input/output pads DQ1 through DQk of a retiming circuit 113 shown in FIG. 3. For the sake of easy description, embodiments of the present disclosure will be described referring to the first data DATA1 exchanged through the fifth and sixth terminals T5 and T6. Omitted is a description on the first address ADDR1 and the first command CMD1 transmitted through the fifth and sixth terminals T5 and T6.

The data retiming unit 117a may contain fourth and fifth reception nodes RX4 and RX5, fourth and fifth transmission nodes TX4 and TX5, and a first flip-flop FF1.

The fourth reception node RX4 may receive the first data DATA1 through the fifth terminal T5. The first data DATA1 received through the fourth reception node RX4 may be sent to the sixth terminal T6 through the fourth transmission node TX4. For example, at a write operation, the first data DATA1 may be transferred from the fifth terminal T5 to the sixth terminal T6 through the fourth reception node RX4 and the fourth transmission node TX4.

The fifth reception node RX5 may receive the first data DATA1 through the sixth terminal T6. The first data DATA1 received through the fifth reception node RX5 may be sent to the first flip-flop FF1. The first flip-flop FF1 may receive the first data DATA1 from the fifth reception node RX5 and the internal signal iDQS from the timing signal processing unit 115a. The first flip-flop FF1 may latch (or, store) and output the first data DATA1 received through the fifth reception node RX5, in synchronization with the internal signal iDQS. That is, the first flip-flop FF1 may rearrange the first data DATA1 in synchronization with the internal signal iDQS. First data DATA1' rearranged by the first flip-flop FF1 may be sent to the fifth terminal T5 through the fifth transmission node TX5.

As described above, the retiming circuit 113a may detect a locking delay from the read enable signal /RE at a read operation of the nonvolatile memory 110. The retiming circuit 113a may produce the internal signal iDQS from the data strobe signal DQS using the detected locking delay. The retiming circuit 113a may rearrange the first data DATA1 using the internal signal iDQS. The retiming circuit 113a may output the first data DATA1' that is thus rearranged, and may output the internal signal iDQS as the data strobe signal DQS.

Required is a locking time when the delay locked loop DLL performs a delay locking operation. Using a locked phase detected from the read enable signal /RE, the retiming circuit 113a according to an embodiment of the present disclosure may produce the internal signal iDQS from the data strobe signal DQS received through the third reception node RX3, without a delay locking operation. Now that the delay locking operation is not performed with respect to the data strobe signal DQS received through the third reception node RX3, the retiming circuit 113a may rearrange the first data DATA1 without affecting an operating performance of the storage device 100.

In FIG. 5, an embodiment of the present disclosure is exemplified as the retiming circuit 113a is associated with input/output pads DQ1 through DQk, pads for transmission of the data strobe signal DQS, and pads for transmission of the read enable signal /RE. Among signals described as being transmitted through the retiming circuit 113 in FIGS.

2 and 3, signals that are not described with reference to FIG. 5 may pass through the retiming circuit 113a without modifications or changes.

Figure 6:
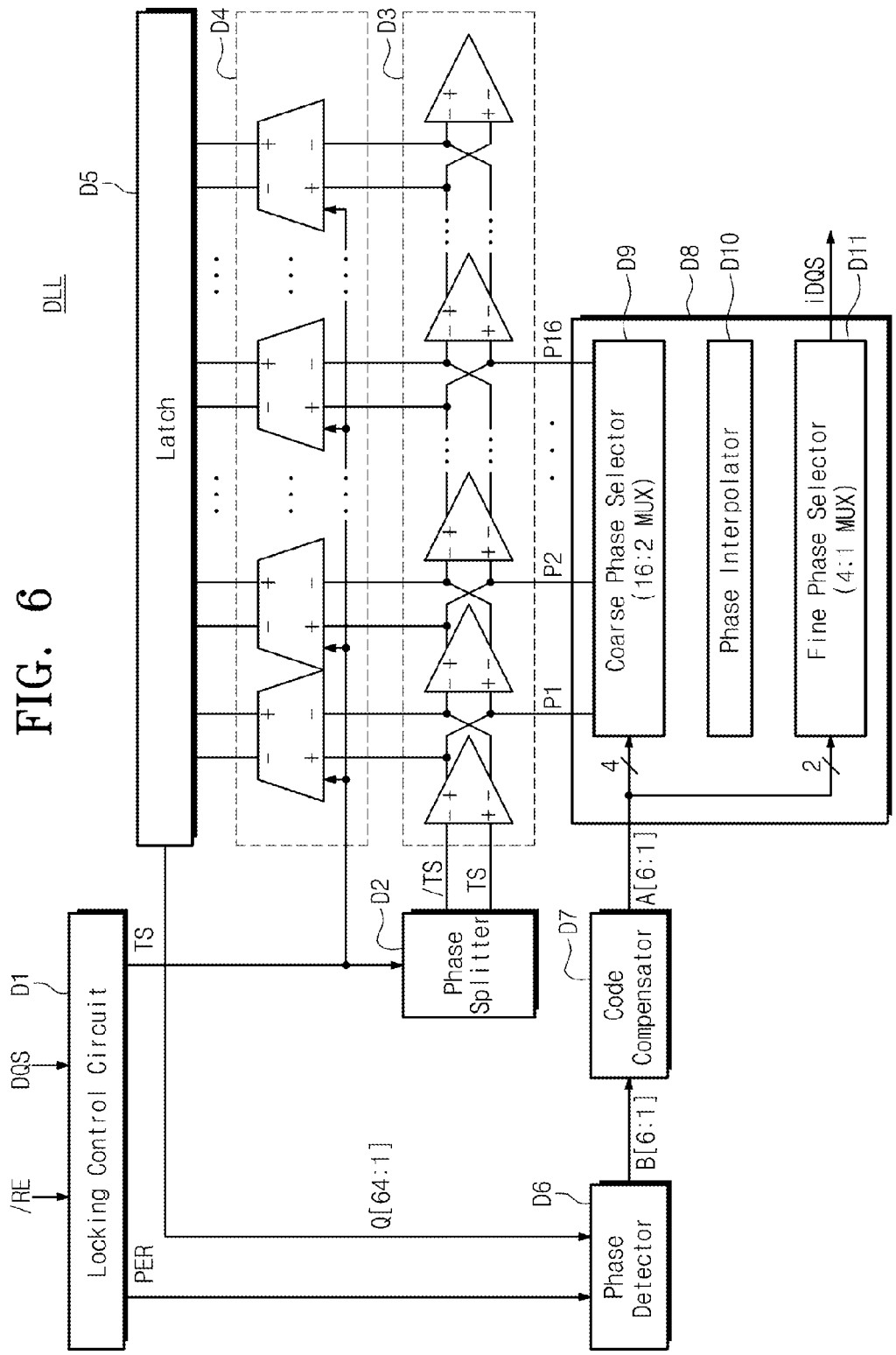
FIG. 6 shows a delay locked loop according to an embodiment of the present disclosure.

FIG. 6 shows a delay locked loop DLL according to an embodiment of the present disclosure. Referring to FIGS. 5 and 6, a delay locked loop DLL may include a locking control circuit D1, a phase splitter D2, a delay line D3, a sensing line D4, a latch D5, a phase detector D6, a code compensator D7, and a phase selector D8.

The locking control circuit D1 may receive a read enable signal /RE from a first reception node RX1 and a data strobe signal DQS from a third reception node RX3. The locking control circuit D1 may store information on a delay locking period where a delay locking operation is performed with respect to the read enable signal /RE. The locking control circuit D1 may output the read enable signal /RE as a timing signal TS during the delay locking period. The locking control circuit D1 can output the data strobe signal DQS as the timing signal TS when a period is not the delay locking period. The locking control circuit D1 may activate a control signal PER during the delay locking period. The locking control circuit D1 may inactivate the control signal PER at no delay locking period. The delay locking period may include at least first one period of the read enable signal /RE.

The phase splitter D2 may receive the timing signal TS from the locking control circuit D1. The phase splitter D2 may produce an inverted timing signal ITS from the timing signal TS. The phase splitter D2 may output the timing signal TS and the inverted timing signal ITS to the delay line D3.

The delay line D3 may contain a plurality of delay units. Each of the plurality of delay units may be an inversion unit that inverts a received signal and outputs the inverted signal. A first delay unit may receive the timing signal TS and the inverted timing signal ITS from the phase splitter D2. The first delay unit may invert and output the timing signal TS and the inverted timing signal /TS. A kth delay unit may invert and output a timing signal TS and an inverted timing signal ITS provided from a k–1$^{st}$ delay unit.

In exemplary embodiments, the delay line D3 may delay the timing signal TS and the inverted timing signal ITS as many as 64 times. That is, the delay line D3 may contain at least 64 delay units. The number of the plurality of delay units of the delay line D3 is not limited to this disclosure. The number of the plurality of delay units of the delay line D3 may be variously changed or modified. Also, the plurality of delay units of the delay line D3 can be changed to delay and output one signal, not complementary signals.

The sensing line D4 may contain a plurality of sensors. Each of the plurality of sensors may sense output signals of a corresponding delay unit of the delay line D3 in synchronization with the timing signal. Each sensor may invert complementary signals received from a corresponding delay unit and may output the inverted signals. Complementary output signals of each sensor of the sensing line D4 or positive signals (or, negative signals) of the complementary output signals may be stored in a latch D5. In case that the delay line D3 delays the timing signal TS and the inverted timing signal ITS as many as 64 times, the sensing line D4 may be formed of 64 sensors. The latch D5 may store a sensing result Q[64:1] of the 64 sensors.

The number of sensors of the sensing line D4 is not limited to this disclosure. The number of sensors of the sensing line D4 may be variously changed or modified. Also, sensors of the sensing line D4 can be changed to delay and output one signal, not complementary signals.

The phase detector D6 may receive the control signal PER from the locking control circuit D1 and the sensing result Q[64:1] from the latch D5. The phase detector D6 may extract a code B[6:1] from the sensing result Q[64:1] while the control signal PER is activated. For example, the phase detector D6 may be configured to detect a position corresponding to one period of the timing signal TS from the sensing result Q[64:1].

For example, when a positive signal of each delay unit of the delay line D3 is 1, a positive signal of a corresponding sensor of the sensing line D4 may be 1. When the positive signal of each delay unit of the delay line D3 is 0, the positive signal of a corresponding sensor of the sensing line D4 may be 0. The sensing result Q[64:1] corresponding to positive signals of sensors of the sensing line D4 may be formed of 1s and 0s. The sensing result Q[64:1] may be formed of the sequence of 1s and the sequence of 0s and vice versa. A value of the sensing result Q[64:1] may be changed at a position where the timing signal TS transits. That is, the phase detector D6 may detect a position corresponding to one period of the timing signal TS, that is, a position on the sensors of the sensing line D4 by monitoring a variation in a value of the sensing result Q[64:1].

The phase detector D6 may further detect a position corresponding to a quarter of the detected one period. The phase detector D6 may store information on a position corresponding to the quarter period, as the code B[6:1]. During an active state of the control signal PER, for example, the phase detector D6 may not output the code B[6:1]. The phase detector D6 may output the code B[6:1] to the code compensator D7 after the control signal PER is inactivated.

The code compensator D7 may receive the code B[6:1] from the phase detector D6. In the code compensator D7, additional delays due to input, output, and processing of the delay locked loop DLL may be applied to compensate for the code B[6:1]. The code compensator D7 may output a compensation code A[6:1] to the phase selector D8.

The phase selector D8 may select one of outputs P1 through P16 of the delay line D3, based on the compensation code A[6:1]. The selected output may be used as an internal signal iDQS.

An embodiment of the present disclosure is exemplified as the phase detector D6 detects a quarter period of the timing signal TS to produce the code B[6:1]. In case that the delay line D3 delays the timing signal TS and the inverted timing signal ITS as many as 64 times, one period of the timing signal TS may be detected at 64 delay points (e.g., 64 sensors). A quarter period of the timing signal TS may be detected at 16 delay points (e.g., 16 sensors) (a quarter of 64). Thus, the phase selector D8 may select a signal, which is delayed by a quarter period from the timing signal TS, by selecting one of the outputs P1 through P16 of the delay line D3.

The phase selector D8 may include a coarse phase selector D9, a phase interpolator D10, and a fine phase selector D11. The coarse phase selector D9 may select two of the outputs P1 through P16, based on four bits of the compensation code A[6:1]. For example, the coarse phase selector D9 may select two closest outputs with a quarter period of the timing signal TS.

The phase interpolator D10 may perform phase interpolation with respect to output signals of the coarse phase selector D9 and may output four signals as an interpolation result. The fine phase selector D11 may select, as an internal signal iDQS, one of four output signals of the phase interpolator D10, based on two bits of the rest of the compensation code A[6:1].

A configuration of the delay locked loop DLL is described with reference to FIG. 6, but the present disclosure is not limited thereto. A configuration of the delay locked loop DLL may be variously changed or modified without departing from the spirit and scope of the present disclosure.

Figure 7:
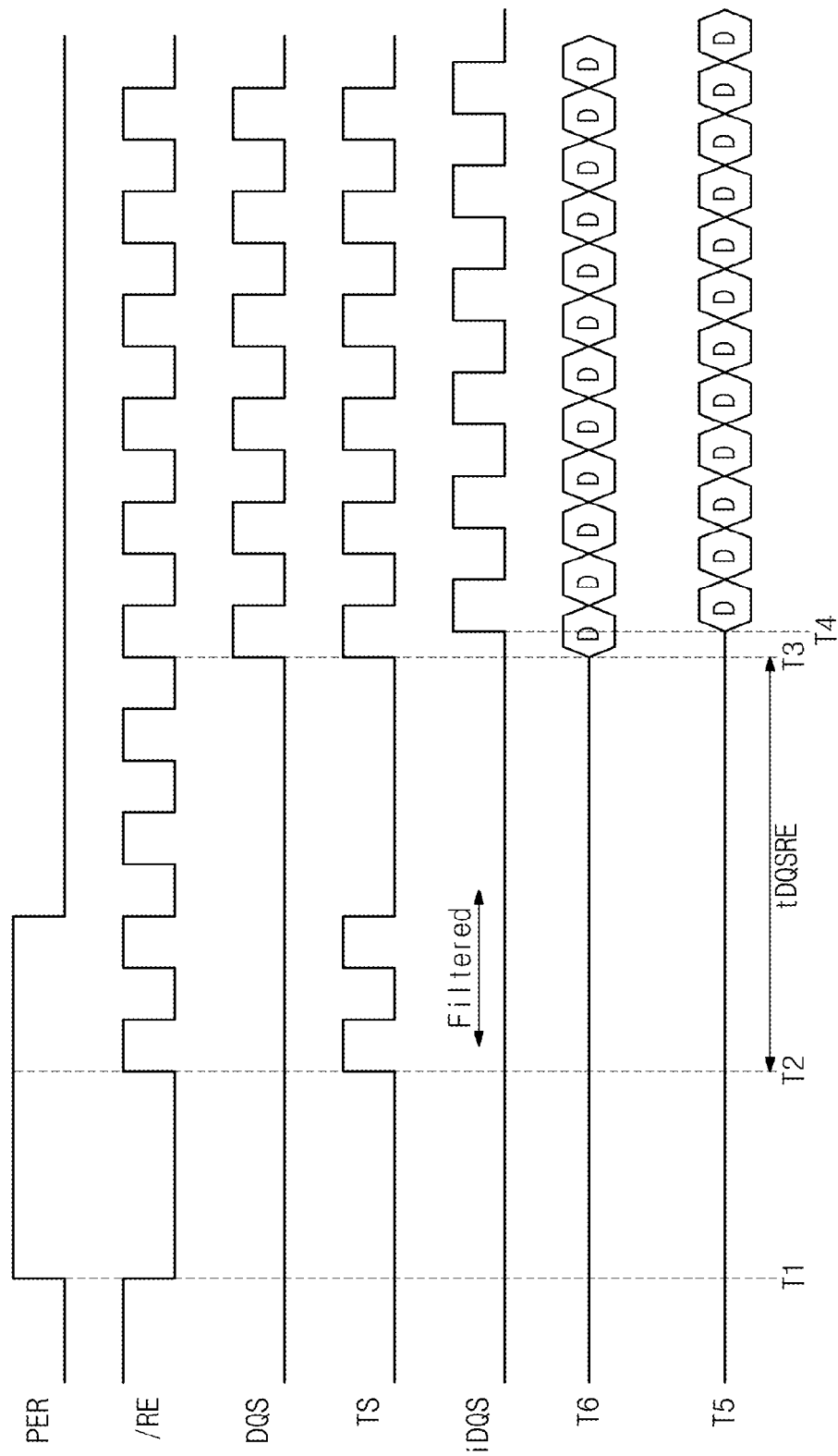
FIG. 7 shows examples of input and output signals of a retiming circuit.

FIG. 7 shows examples of input and output signals of a retiming circuit 113a. Illustrated in FIG. 7 are input and output signals of a retiming circuit 113a at a read operation of a nonvolatile memory 110. Referring to FIGS. 1 and 5 through 7, a read enable signal /RE may be activated at T1. For example, a memory controller 120 may activate the read enable signal /RE when performing a read operation on the nonvolatile memory 110. When the read enable signal /RE is activated, a control signal PER may be also activated at T1.

After being activated, the read enable signal /RE may be periodically toggled from T2. For example, if a read preamble time tRPRE elapses after the read enable signal /RE is activated, the read enable signal /RE may be periodically toggled from T2.

The control signal PER may be inactivated after the read enable signal /RE is periodically toggled and then a time (or, a phase) corresponding to 1.5 times a period elapses. For example, the control signal PER may maintain an active state until the read enable signal /RE is toggled two times (or, transits four times).

The read enable signal /RE may be output as a timing signal TS while the control signal PER is activated. As the read enable signal /RE is toggled, the timing signal TS may be toggled (or transit) over 1.5 times a period during the activation of the control signal PER. A phase detector D6 of the delay locked loop DLL may detect a locking delay corresponding to a quarter period of the timing signal TS while the timing signal TS transits according to the read enable signal /RE.

During inactivation of the control signal PER, that is, while the delay locked loop DLL detects the locking delay, the retiming circuit 113a may not output a signal. For example, the phase detector D6 may not output a code B[6:1] during activation of the control signal PER. Even though the timing signal TS is toggled (or, transits), thus, an internal signal iDQS may maintain an inactive state.

If a predetermined time tDQSRE elapses after the read enable signal /RE starts to be toggled (or, transit) periodically, at T3, a data strobe signal DQS may start to be toggled (or, transit). For example, a nonvolatile memory device 111 may receive the read enable signal /RE, which periodically transits from T2, through a second terminal T2 of the retiming circuit 113a. The nonvolatile memory device 111 may transmit the data strobe signal DQS periodically transiting to a fourth terminal T4 of the retiming circuit 113a, based on the read enable signal /RE periodically toggled.

The data strobe signal DQS may have the same period or frequency as the read enable signal /RE. The nonvolatile memory device 111 may make the data strobe signal DQS start to transit, when the predetermined time tDQSRE elapses after the read enable signal /RE starts to periodically transit.

If the data strobe signal DQS starts to transit, the delay locked loop DLL may produce the internal signal iDQS from the data strobe signal DQS, based on the locking delay detected from the read enable signal /RE. The phase detector D6 may produce the internal signal iDQS from the data strobe signal DQS, based on the locking delay of a quarter period from the read enable signal /RE.

Now that the control signal PER is at an inactive state, the data strobe signal DQS may be provided as the timing signal TS. Since the control signal PER is at an inactive state, the phase detector D6 may output, as the internal signal iDQS, a signal produced by delaying the data strobe signal DQS as much as the locking delay of the quarter period.

The nonvolatile memory device 111 may transmit first data DATA1 to a sixth terminal T6 of the retiming circuit 113a at the same time when the data strobe signal DQS starts to transit.

A first flip-flop FF1 of a data retiming unit 117a may store and output the first data DATA1 received through the sixth terminal T6 in synchronization with the internal signal iDQS. The internal signal iDQS may be a signal that is produced by delaying the data strobe signal DQS as much as the locking delay of the quarter period. Thus, the first flip-flop FF1 may store and output the first data DATA1 received through the sixth terminal T6 at optimal timing in synchronization with the internal signal iDQS.

First data DATA1' rearranged by the first flip-flop FF1 may be synchronized with the internal signal iDQS. The retiming circuit 113a may output the internal signal iDQS through a third terminal T3, as the data strobe signal DQS synchronized with the first data DATA1' that is thus rearranged.

In accordance with an embodiment described with reference to FIGS. 5 through 7, the locking delay may be detected during a delay time tDQSRE between an activation time of the read enable signal /RE and an activation time of the data strobe signal DQS. That is, an operation in which the retiming circuit 113a detects the locking delay may be shadowed by normal operations of a storage device 100, and thus a separate time may not be needed. Also, since the internal signal iDQS is produced from the data strobe signal DQS using the previously detected locking delay, only a delay of a quarter period that is the previously detected locking delay may be required without a separate time taken to produce the internal signal iDQS. Thus, the reliability of the storage device 100 may be improved by rearranging the first data DATA1 without hindering an operating performance (or, operating speed) of the storage device 100.

Figure 8:
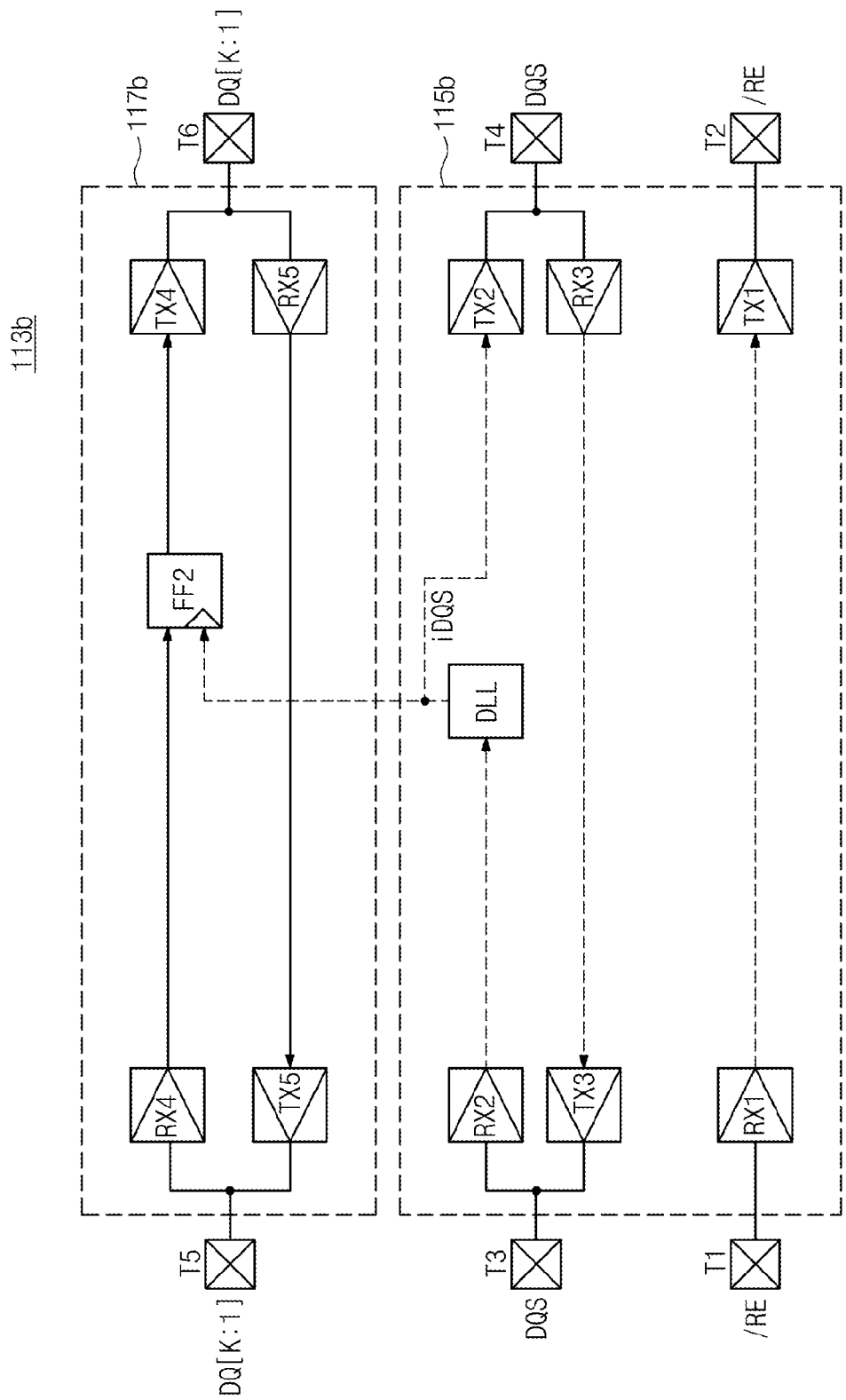
FIG. 8 shows a retiming circuit according to a second embodiment of the present disclosure.

FIG. 8 shows a retiming circuit 113b according to a second embodiment of the present disclosure. Referring to FIG. 8, a retiming circuit 113b may contain a timing signal processing unit 115b and a data retiming unit 117b.

As compared with a retiming circuit 113a shown in FIG. 5, in the time signal processing unit 115b, a data strobe signal DQS received through a fourth terminal T4 and a third reception node RX3 may be transferred to a third terminal T3 through a third transmission node TX3. The data strobe signal DQS received through the third terminal T3 and a second reception node RX2 may be sent to a delay locked loop DLL.

The delay locked loop DLL may receive the data strobe signal DQS which is received through the second reception node RX2. The delay locked loop DLL may detect a locking delay from the data strobe signal DQS and may produce an internal signal iDQS from the data strobe signal DQS using the detected locking delay. The delay locked loop DLL may output, as the internal signal iDQS, a signal that is delayed from the data strobe signal DQS as much as a quarter period of the data strobe signal DQS. The internal signal iDQS from the delay locked loop DLL may be transferred to a fourth terminal T4 through a second transmission node TX2. Also, the internal signal iDQS may be sent to the data retiming unit 117b.

In the data retiming unit 117b, first data DATA1 received through a sixth terminal T6 and a fifth reception node RX5 may be transferred to a fifth terminal T5 through a fifth transmission node TX5. The first data DATA1 received through the fifth terminal T5 and a fourth reception node RX4 may be transferred to a second flip-flop FF2. The second flip-flop FF2 may store and output the first data DATA1 in synchronization with the internal signal iDQS received from the timing signal processing unit 115b. That is, the second flip-flop FF2 may rearrange the first data DATA1. First data DATA1' rearranged by the second flip-flop FF2 may be transmitted to the sixth terminal T6 through a fourth transmission node TX4.

Figure 9:
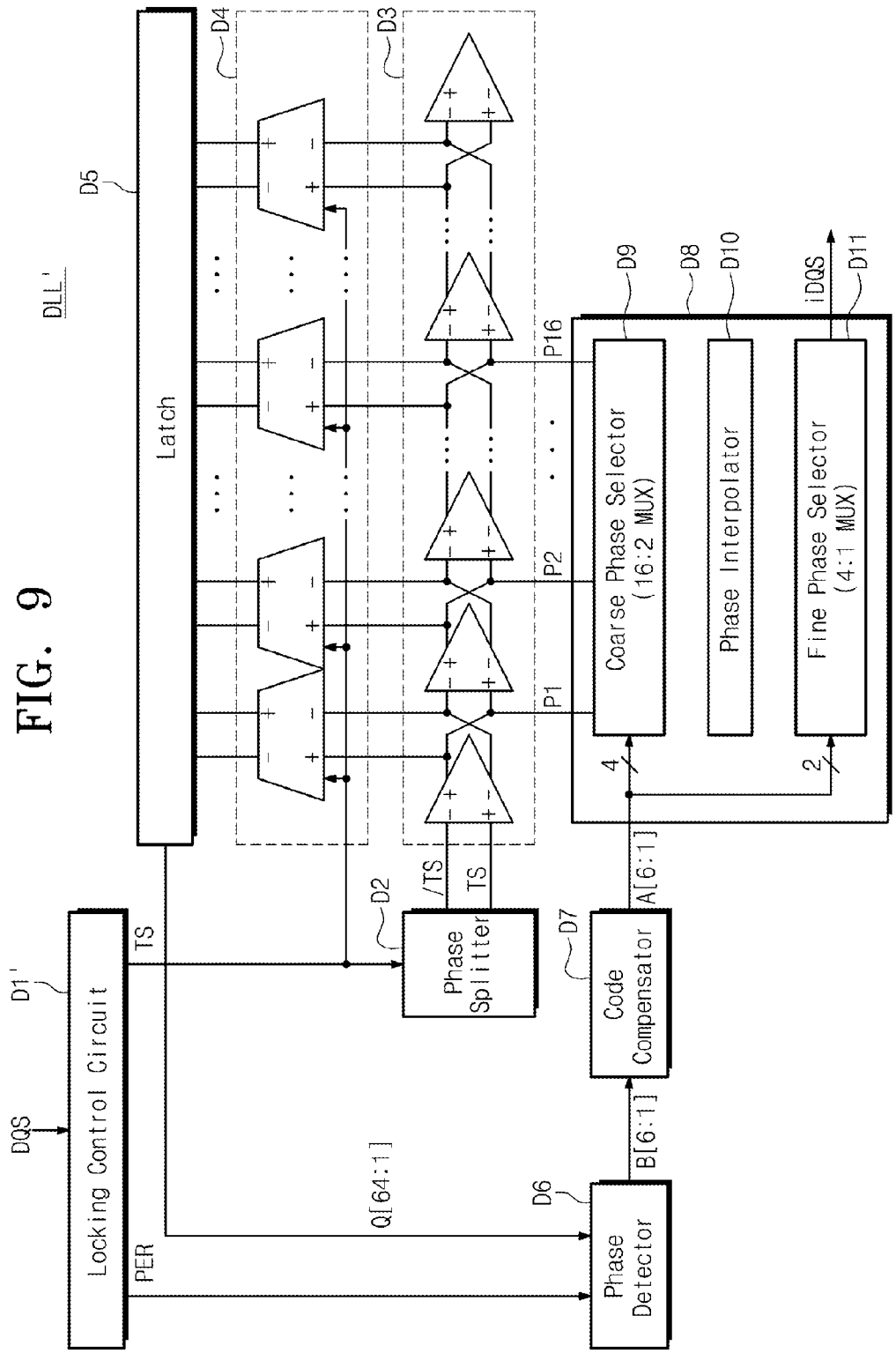
FIG. 9 shows a delay locked loop according to a second embodiment of the present disclosure.

FIG. 9 shows a delay locked loop DLL' according to a second embodiment of the present disclosure. Referring to FIGS. 8 and 9, a delay locked loop DLL' may include a locking control circuit D1', a phase splitter D2, a delay line D3, a sensing line D4, a latch D5, a phase detector D6, a code compensator D7, and a phase selector D8.

In comparison to a delay locked loop DLL shown in FIG. 6, the locking control circuit D1' may receive a data strobe signal DQS from a second reception node RX2. The locking control circuit D1' may output the data strobe signal DQS as a timing signal TS regardless of a control signal PER. The locking control circuit D1' may maintain an active state during two periods of the data strobe signal DQS and then may be inactivated.

Figure 10:
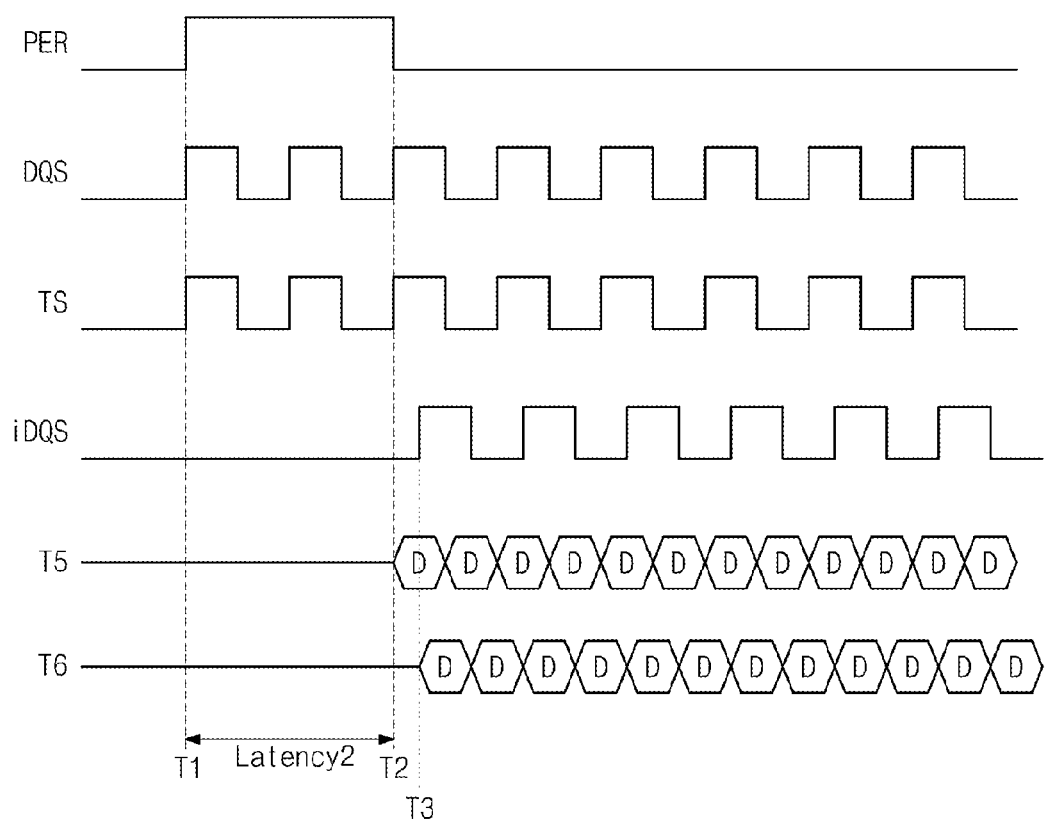
FIG. 10 shows examples of input and output signals of a retiming circuit.

FIG. 10 shows examples of input and output signals of a retiming circuit 113b. Illustrated in FIG. 10 are input and output signals of the retiming circuit 113b at a write operation of a nonvolatile memory 110. Referring to FIGS. 1 and 8 through 10, a data strobe signal DQS may start to transit (or to be toggled) at T1. For example, a memory controller 120 may make the data strobe signal DQS periodically transit when performing a write operation on the nonvolatile memory 110. When the data strobe signal DQS is periodically toggled, a control signal PER may be also activated at T1.

The control signal PER may be inactivated when the data strobe signal DQS transits periodically and a time corresponding (or, a phase) to two periods elapses. For example, the control signal PER may maintain an active state until the data strobe signal DQS is toggled two times (or, transits four times).

The data strobe signal DQS may be provided as a timing signal TS regardless of whether the control signal PER is activated. Thus, the timing signal TS may have the same waveform as the data strobe signal DQS.

A phase detector D6 of a delay locked loop DLL may detect a locking delay corresponding to a quarter period of the timing signal TS during inactivation of the control signal PER.

During activation of the control signal PER, that is, while the delay locked loop DLL detects locking delay, the retiming circuit 113b may not output a signal. For example, the phase detector D6 may not output a code B[6:1] during activation of the control signal PER. Even though the timing signal TS is toggled (or, transits), thus, an internal signal iDQS may maintain an inactive state.

After the control signal PER is inactivated, at T2, the phase detector D6 may output a code B[6:1]. Thus, the delay locked loop DLL may output an internal signal iDQS that is delayed from the data strobe signal DQS as much as a quarter period.

In exemplary embodiments, a memory controller 120 may control the data strobe signal DQS according to "Latency2" that is defined in the standard of a toggle NAND flash memory. With the "Latency2", the memory controller 120 may transmit first data DATA1 synchronized with the data strobe signal DQS after toggling the data strobe signal DQS during two periods. Thus, after the data strobe signal DQS is toggled during two periods, at T2, the memory controller 120 may transmit the first data DATA1 synchronized with the data strobe signal DQS to a fifth terminal T5.

A second flip-flop FF1 of a data retiming unit 117a may store and output the first data DATA1 received through a fifth terminal T5 in synchronization with the internal signal iDQS. The internal signal iDQS may be a signal that is produced by delaying the data strobe signal DQS as much as the locking delay of the quarter period. Thus, the first flip-flop FF1 may store and output the first data DATA1 received through the fifth terminal T5 at optimal timing in synchronization with the internal signal iDQS.

First data DATA1' rearranged by the second flip-flop FF2 may be synchronized with the internal signal iDQS. The retiming circuit 113b may output the internal signal iDQS through a fourth terminal T4, as the data strobe signal DQS synchronized with the first data DATA1' that is thus rearranged.

In accordance with an embodiment described with reference to FIGS. 8 through 10, a locking delay is detected during a dummy toggle period of the data strobe signal DQS that is defined by "Latency2". That is, an operation in which the retiming circuit 113b detects the locking delay may be shadowed by normal operations of a storage device 100, and so a separate time may not be needed. Also, since the internal signal iDQS is produced from the data strobe signal DQS using previously detected locking delay, only a delay of a quarter period that is the previously detected locking delay may be required without a separate time taken to produce the internal signal iDQS. Thus, the reliability of the storage device 100 may be improved by rearranging the first data DATA1 without hindering an operating performance (or, operating speed) of the storage device 100.

Figure 11:
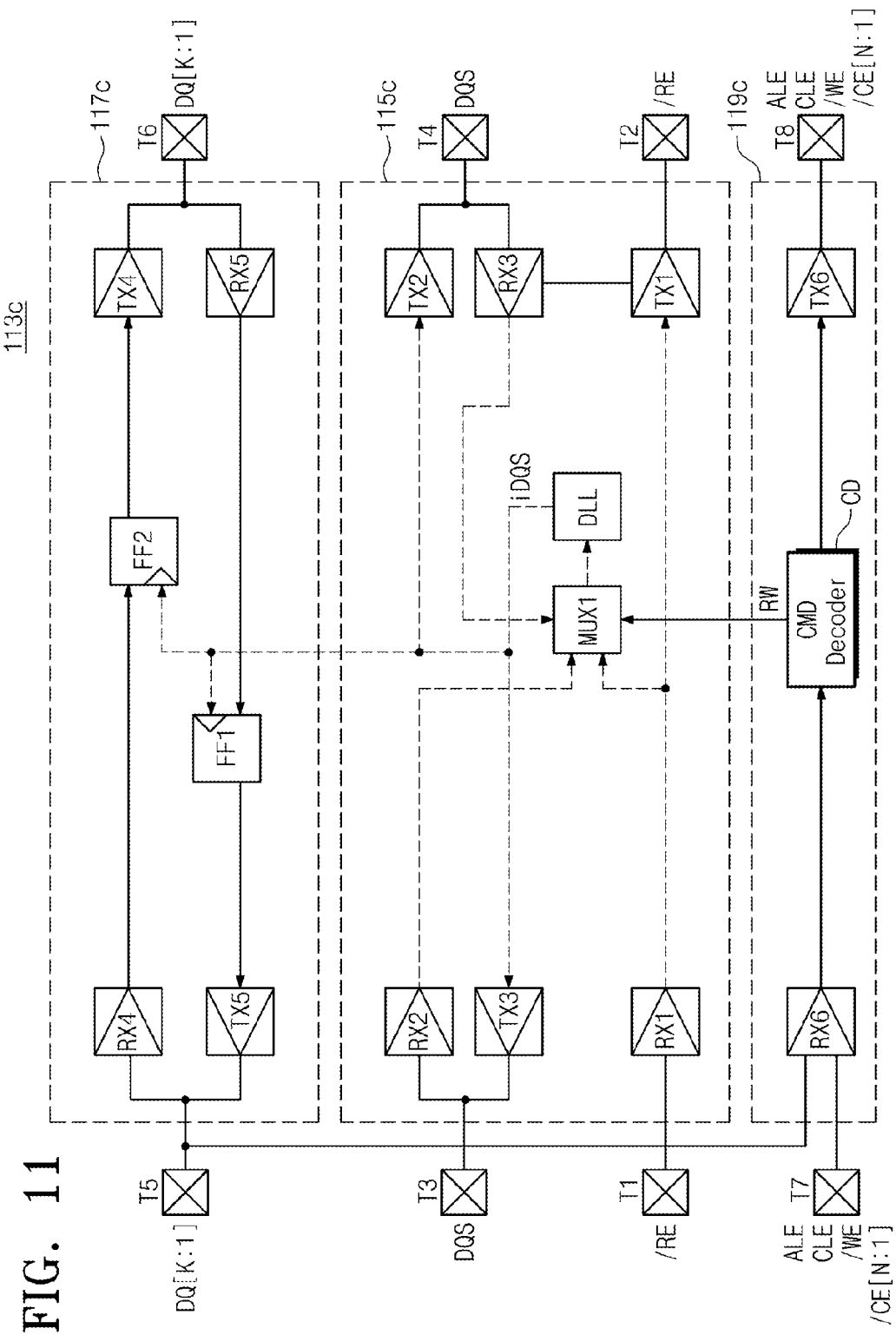
FIG. 11 shows a retiming circuit according to a third embodiment of the present disclosure.

FIG. 11 shows a retiming circuit 113c according to a third embodiment of the present disclosure. Referring to FIG. 11, a retiming circuit 113c may contain a timing signal processing unit 115c, a data retiming unit 117c, and a command identification unit 119c.

In comparison to retiming circuits 113a and 113b shown in FIGS. 5 and 8, the retiming circuit 113c may further include the command identification unit 119c. The command identification unit 119c may receive an address latch enable signal ALE, a command latch enable signal CLE, a write enable signal /WE, and chip enable signals /CE1 through /CEN from a memory controller 120 through a seventh terminal T7. The seventh terminal T7 may correspond to pads for receiving the address latch enable signal ALE, the command latch enable signal CLE, the write enable signal /WE, and the chip enable signals /CE1 through /CEN (refer to FIG. 2). Also, the command identification unit 119c may receive a first command CMD1 through a fifth terminal T5.

The command identification unit 119c may output the address latch enable signal ALE, the command latch enable signal CLE, the write enable signal /WE, and the chip enable signals /CE1 through /CEN to a nonvolatile memory device 111 through an eighth terminal T8. The eighth terminal T9 may correspond to pads of a retiming circuit 113 for outputting the address latch enable signal ALE, the command latch enable signal CLE, the write enable signal /WE, and the chip enable signals /CE1 through /CEN (refer to FIG. 3).

The command identification unit 119c may contain a sixth reception node RX6, a sixth transmission node TX6, and a command decoder CD.

The sixth reception node RX6 may receive the address latch enable signal ALE, the command latch enable signal CLE, the write enable signal /WE, and the chip enable signals /CE1 through /CEN from a seventh terminal T7. The address latch enable signal ALE, the command latch enable signal CLE, the write enable signal /WE, and the chip enable signals /CE1 through /CEN received through the sixth reception node RX6 may be transmitted to the command decoder CD.

The command decoder CD may determine whether a signal received through a fifth terminal T5 is a first command CMD1, based on the address latch enable signal ALE, the command latch enable signal CLE, the write enable signal /WE, and the chip enable signals /CE1 through /CEN received from the seventh terminal T7.

For example, when a memory controller 120 may activate one of the chip enable signals /CE1 through /CEN (e.g., logical low level), may activate the command latch enable signal CLE (e.g., logical high level), may inactivate the address latch enable signal ALE (e.g., logical low level), and may make the write enable signal /WE transi from activation (e.g., logical low level) to inactivation (e.g., logical high level) (i.e., inactivates the write enable signal /WE after activating the write enable signal /WE), the retiming circuit 113 may recognize that the first command CMD1 is received through the fifth terminal T5.

When the first command CMD1 is received through the fifth terminal T5, the command decoder CD may determine whether the first command CMD1 thus received is a read command or a write command. The command decoder CD may control a control signal RW according to the determination result. For example, if the first command CMD1 is a read command, the command decoder CD may set the control signal RW to a first value. As a consequence of determining that the first command CMD1 is a write command, the command decoder CD may set the control signal RW to a second value. The command decoder CD may inactivate the control signal RW when the first command CMD1 is neither the read command nor the write command. The control signal RW may be transmitted to the timing signal processing unit 115c.

The command decoder CD may output an address latch enable signal ALE, a command latch enable signal CLE, a write enable signal /WE, and chip enable signals /CE1 through /CEN to an eighth terminal T8 from a sixth transmission node TX6.

A read enable signal /RE received through a first terminal T1 and a first reception node RX1 may be transmitted to a first multiplexer MUX1, and the read enable signal /RE may be sent to a second terminal T2 through a first transmission node TX1.

A data strobe signal DQS received through a third terminal T3 and a second reception node RX2 may be transmitted to the first multiplexer MUX1, and a data strobe signal DQS received through a fourth terminal T4 and a third reception node RX3 may be provided to the first multiplexer MUX1.

The first multiplexer MUX1 may receive a read enable signal /RE from a first reception node RX1, the data strobe signal DQS from the second reception node RX2, the data strobe signal DQS from the third reception node RX3, and the control signal RW from the command decoder CD. When the control signal RW indicates a read operation, the first multiplexer MUX1 may transmit the read enable signal /RE received from the first reception node RX1, and the data strobe signal DQS received from the third reception node RX3, to a delay locked loop DLL. When the control signal RW indicates a write operation, the first multiplexer MUX1 may transmit the data strobe signal DQS received from the second reception node RX2 to the delay locked loop DLL.

The delay locked loop DLL, at a read operation, may receive the read enable signal /RE and the data strobe signal DQS from the first multiplexer MUX1. As described with reference to FIGS. 5 through 7, the delay locked loop DLL may detect a locking delay corresponding to a quarter period from the read enable signal /RE and may output an internal signal iDQS, which is delayed from the data strobe signal DQS as much as a quarter period, using the detected locking delay. The internal signal iDQS may be transferred to the data retiming unit 117c and may be output as a data strobe signal DQS through the third transmission node TX3 and the third terminal T3.

At a write operation, the delay locked loop DLL may receive from the first multiplexer MUX1 the data strobe signal DQS which is received from the second reception node RX2. As described with reference to FIGS. 8 through 10, the delay locked loop DLL may detect the locking delay corresponding to a quarter period from the data strobe signal DQS and may output the internal signal iDQS, which is delayed from the data strobe signal DQS as much as a quarter period, using the detected locking delay. The internal signal iDQS may be transferred to the data retiming unit 117c and may be output as the data strobe signal DQS through the second transmission node TX2 and the fourth terminal T4.

In the data retiming unit 117c, at a read operation, a first flip-flop FF1 may rearrange first data DATA1 received through a sixth terminal T6 and a fifth reception node RX5, in synchronization with the internal signal iDQS as described with reference to FIGS. 5 through 7. At a write operation, a second flip-flop FF2 may rearrange the first data DATA1 received through the fifth terminal T5 and the fourth reception node RX4, in synchronization with the internal signal iDQS as described with reference to FIGS. 8 through 10.

As described above, the retiming circuit 113c may retime first data DATA1 exchanged between the memory controller 120 and the nonvolatile memory 110 at a read operation and a write operation. Retiming of the retiming circuit 113c may be shadowed by normal operations of a storage device 100, thereby not needing a separate time. The retiming circuit 113c may rearrange the first data DATA1 without hindering an operating performance (or, operating speed) of the storage device 100, thereby improving the reliability of the storage device 100.

Figure 12:
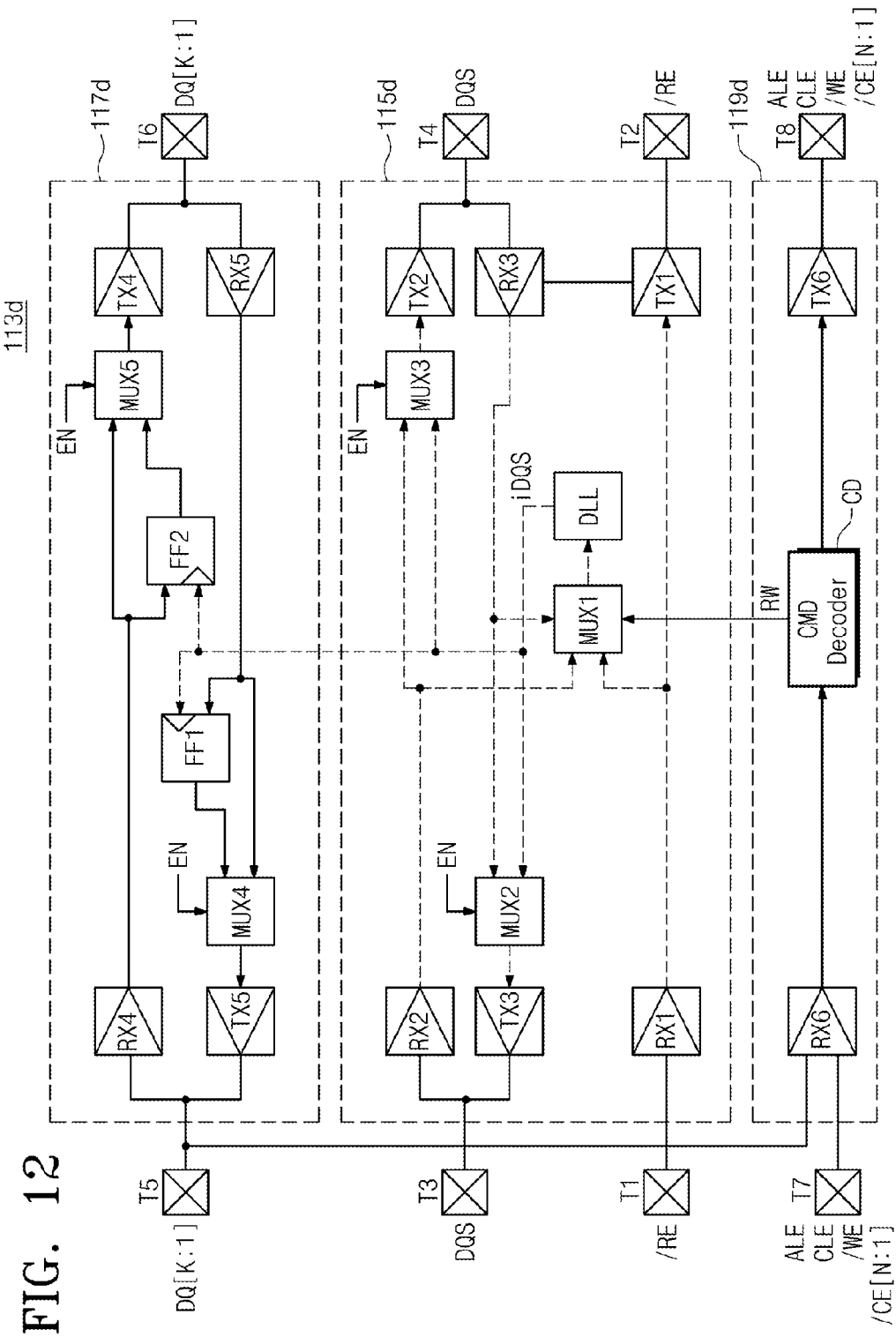
FIG. 12 shows a retiming circuit according to a fourth embodiment of the present disclosure.

FIG. 12 shows a retiming circuit 113d according to a fourth embodiment of the present disclosure. Referring to FIG. 12, a retiming circuit 113d may contain a timing signal processing unit 115d, a data retiming unit 117d, and a command identification unit 119d. The retiming circuit 113d may selectively perform retiming on first data DATA1 as compared to a retiming circuit 113c shown in FIG. 11.

The timing signal processing unit 115d may be different from a timing signal processing unit 115c shown in FIG. 11. The timing signal processing unit 115d may further comprise second and third multiplexers MUX2 and MUX3. The second multiplexer MUX2 may receive an internal signal iDQS from a delay locked loop DLL and may receive a data strobe signal DQS through a fourth terminal T4 and a third reception node RX3. In response to an activation signal EN, the second multiplexer MUX2 may transmit the internal signal iDQS or the data strobe signal DQS to a third transmission node TX3.

The third multiplexer MUX3 may receive the internal signal iDQS from the delay locked loop DLL and may receive the data strobe signal DQS through a third terminal T3 and a second reception node RX2. In response to the activation signal EN, the third multiplexer MUX3 may send the internal signal iDQS or the data strobe signal DQS to a second transmission node TX2.

The data retiming unit 117d may be different from that the data retiming unit 117c shown in FIG. 11. The data retiming unit 117d may further comprise fourth and fifth multiplexers MUX4 and MUX5. The fourth multiplexer MUX4 may receive first data DATA1' rearranged by a first flip-flop FF1 and may receive the first data DATA1 through a sixth terminal T6 and a fifth reception node RX5. In response to the activation signal EN, the fourth multiplexer MUX4 may provide a fifth transmission node TX5 with the rearranged first data DATA1' or the first data DATA1.

The fifth multiplexer MUX5 may receive first data DATA1' rearranged by a second flip-flop FF2 and may receive the first data DATA1 through a fifth terminal T5 and a fourth reception node RX4. In response to the activation signal EN, the fifth multiplexer MUX5 may provide the rearranged first data DATA1' or the first data DATA1 to a fourth transmission node TX4.

When the activation signal EN is at an active state, the internal signal iDQS may be output as a data strobe signal DQS through the second multiplexer MUX2 or the third multiplexer MUX3. When the activation signal EN is at an inactive state, the data strobe signal DQS may be output through the second multiplexer MUX2 or the third multiplexer MUX3.

When the activation signal EN is at an active state, the first data DATA1' rearranged in synchronization with the internal signal iDQS may be output through the fourth multiplexer MUX4 or the fifth multiplexer MUX5. When the activation signal EN is at an inactive state, the first data DATA1 synchronized with the data strobe signal DQS may be output through the fourth multiplexer MUX4 or the fifth multiplexer MUX5.

That is, the retiming circuit 113d may selectively perform a retiming operation according to the activation signal EN. In exemplary embodiments, the activation signal EN may be provided from a memory controller 120. For example, the activation signal EN may be provided to the retiming circuit 113d or a nonvolatile memory 110, and may be produced according to a value of a register controlled by the memory controller 120.

Figure 13:
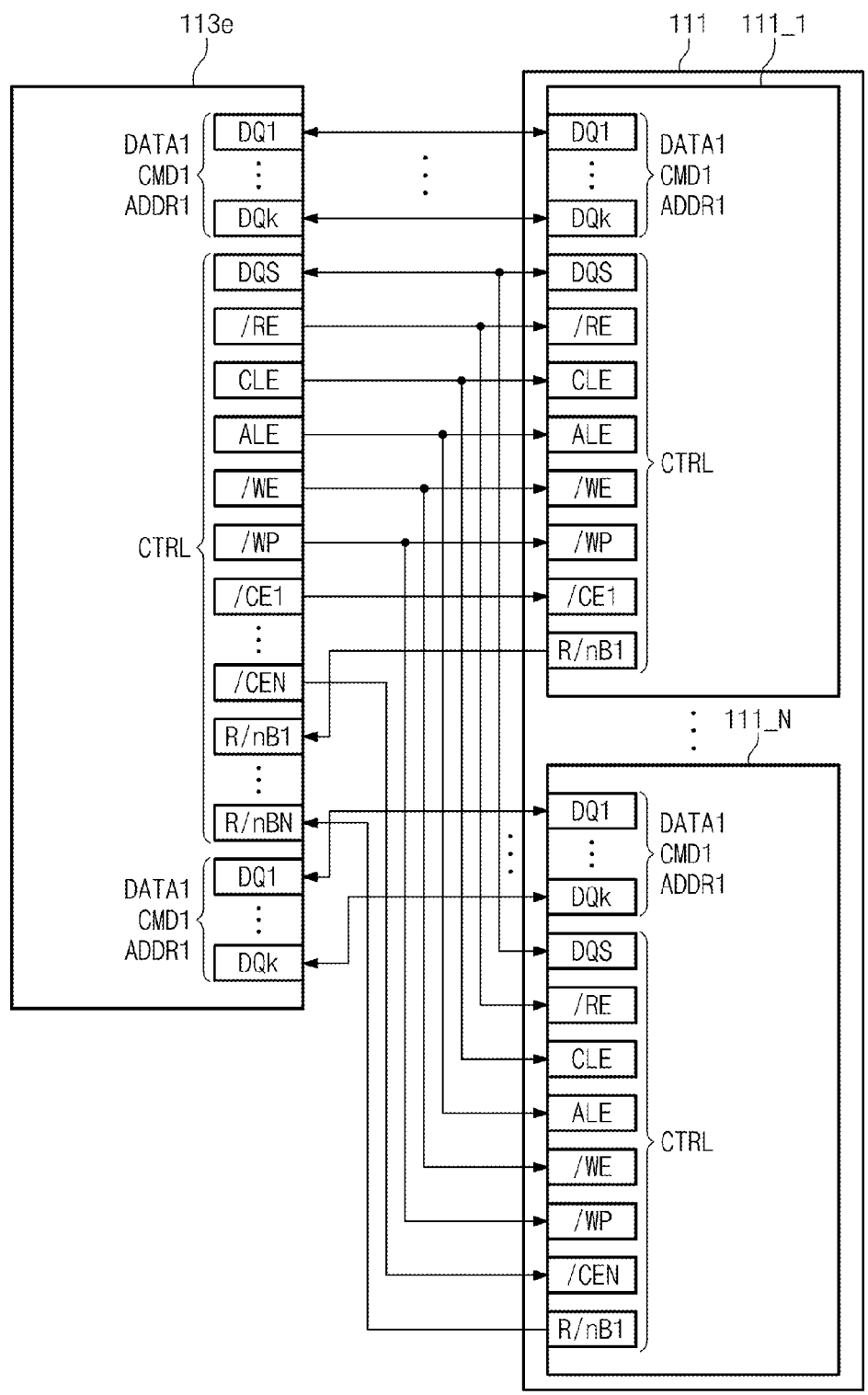
FIG. 13 is a block diagram schematically illustrating an interconnection between a retiming circuit and a plurality of a nonvolatile memory device, according to still another embodiment of the present disclosure.

FIG. 13 is a block diagram schematically illustrating an interconnection between a retiming circuit 113e and a plurality of nonvolatile memory devices 111, according to still another embodiment of the present disclosure. As compared with a retiming circuit 113 shown in FIG. 3, the retiming circuit 113e may comprise separate input/output pads DQ1 through DQk for communication with a plurality of nonvolatile memory devices 111_1 through 111_N. The input/output pads DQ1 through DQk for communication between the retiming circuit 113e and the nonvolatile memory device 111_1 may be different from the input/output pads DQ1 through DQk for communication between the retiming circuit 113e and the nonvolatile memory device 111_N.

Figure 14:
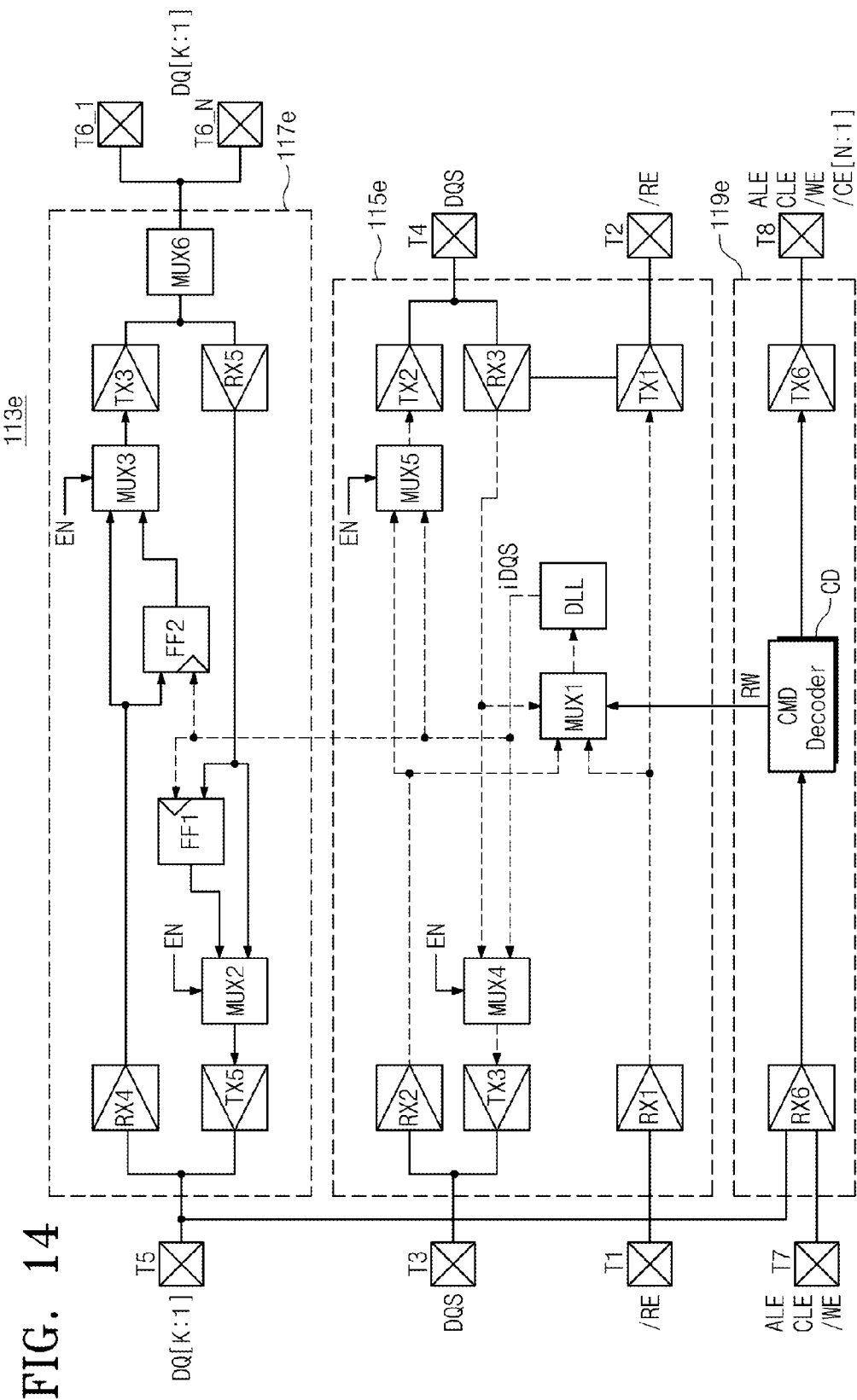
FIG. 14 shows a retiming circuit according to a fifth embodiment of the present disclosure.

FIG. 14 shows a retiming circuit 113e according to a fifth embodiment of the present disclosure. Referring to FIG. 14, a retiming circuit 113e may contain a timing signal processing unit 115e, a data retiming unit 117e, and a command identification unit 119e. As compared to the retiming circuit 113d shown in FIG. 12, the retiming circuit 113e may exchange first data DATA1, a first address ADDR1, or a first command CMD1 with the plurality of nonvolatile memory devices 111_1 through 111_N through a plurality of sixth terminals T6_1 through T6_N. Each of the plurality of sixth terminals T6_1 through T6_N may correspond to a set of input/output pads DQ1 through DQk of the retiming circuit 113e shown in FIG. 13.

The data retiming unit 117e may be different from a data retiming unit 117d shown in FIG. 12. The data retiming unit 117e may further include a sixth multiplexer MUX6. The sixth multiplexer MUX6 may transmit the first data DATA1, the first command CMD1, or the first address ADDR1 received through a fourth transmission node TX4 to one of the sixth terminals T6_1 through T6_N. For example, the sixth multiplexer MUX6 may receive a plurality of chip enable signals /CE1 through /CEN through a seventh terminal T6. The sixth multiplexer MUX6 may provide the first data DATA1, the first command CMD1, or the first address ADDR1 to one sixth terminal, corresponding to an activated chip enable signal, among the sixth terminals T6_1 through T6_N.

The sixth multiplexer MUX6 may transfer the first data DATA1, received from one of the sixth terminals T6_1 through T6_N, to a fifth reception node RX5.

In FIGS. 13 and 14, an embodiment of the present disclosure is exemplified as the retiming circuit 113e communicates with the plurality of nonvolatile memory devices 111_1 through 111_N through different input/output pads. In this case, the number of the sixth terminals T6_1 through T6_N may be equal to the number of the plurality of nonvolatile memory devices 111_1 through 111_N.

The plurality of nonvolatile memory devices 111_1 through 111_N may be divided into a plurality of groups. Each of the plurality of groups may contain two or more nonvolatile memory devices. The retiming circuit 113e may communicate with the plurality of groups through different input/output pads. In this case, the number of the sixth terminals of the data retiming unit 117e may be equal to the number of the plurality of groups. Two or more nonvolatile memory devices in each group may share a sixth terminal.

Figure 15:
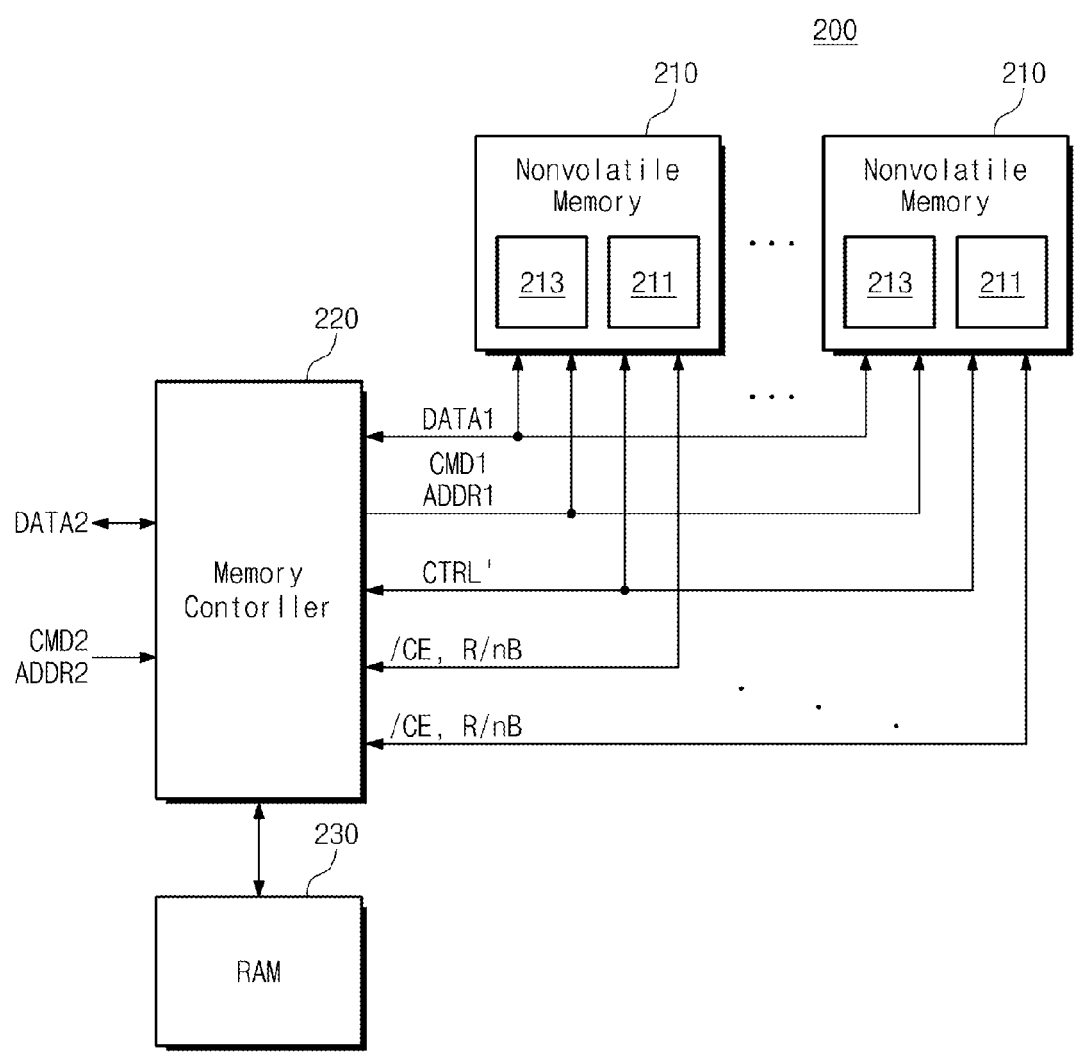
FIG. 15 is a block diagram schematically illustrating a storage device according to a second embodiment of the present disclosure.

FIG. 15 is a block diagram schematically illustrating a storage device 200 according to a second embodiment of the present disclosure. Referring to FIG. 15, a storage device 200 may contain a plurality of nonvolatile memories 210, a memory controller 220, and a RAM 230. Each of the plurality of nonvolatile memories 210 may contain a plurality of nonvolatile memory devices 211 and a retiming circuit 213. Each of the plurality of nonvolatile memories 210 may have the same structure as a nonvolatile memory 110 described with reference to FIGS. 2 through 14, and may operate in the same way as the nonvolatile memory 110. The retiming circuit 213 may perform a retiming operation between the plurality of nonvolatile memory devices 211 and the memory controller 220.

The memory controller 220 may exchange first data DATA1, a first command CMD1, and a first address ADDR1 with the plurality of nonvolatile memories 210 through a common channel. The memory controller 220 may exchange a control signal CTRL' with the plurality of nonvolatile memories 210 through the common channel. The control signal CTRL' may include a command latch enable signal CLE, an address latch enable signal ALE, a read enable signal /RE, a write enable signal /WE, and a write protection signal /WP.

A chip enable signal /CE and a ready/busy signal R/nB may be exchanged between the memory controller 220 and the plurality of nonvolatile memories 210 through different channels. The memory controller 220 may control the chip enable signal /CE such that the plurality of nonvolatile memories 210 or the plurality of nonvolatile memory devices 211 in each of the plurality of nonvolatile memories 210 can be independently selected. Also, the memory controller 220 may identify whether the plurality of nonvolatile memories 210 and the plurality of nonvolatile memory devices 211 in each of the plurality of nonvolatile memories 210 are at a communication-possible state, based on the ready/busy signal R/nB.

Figure 16:
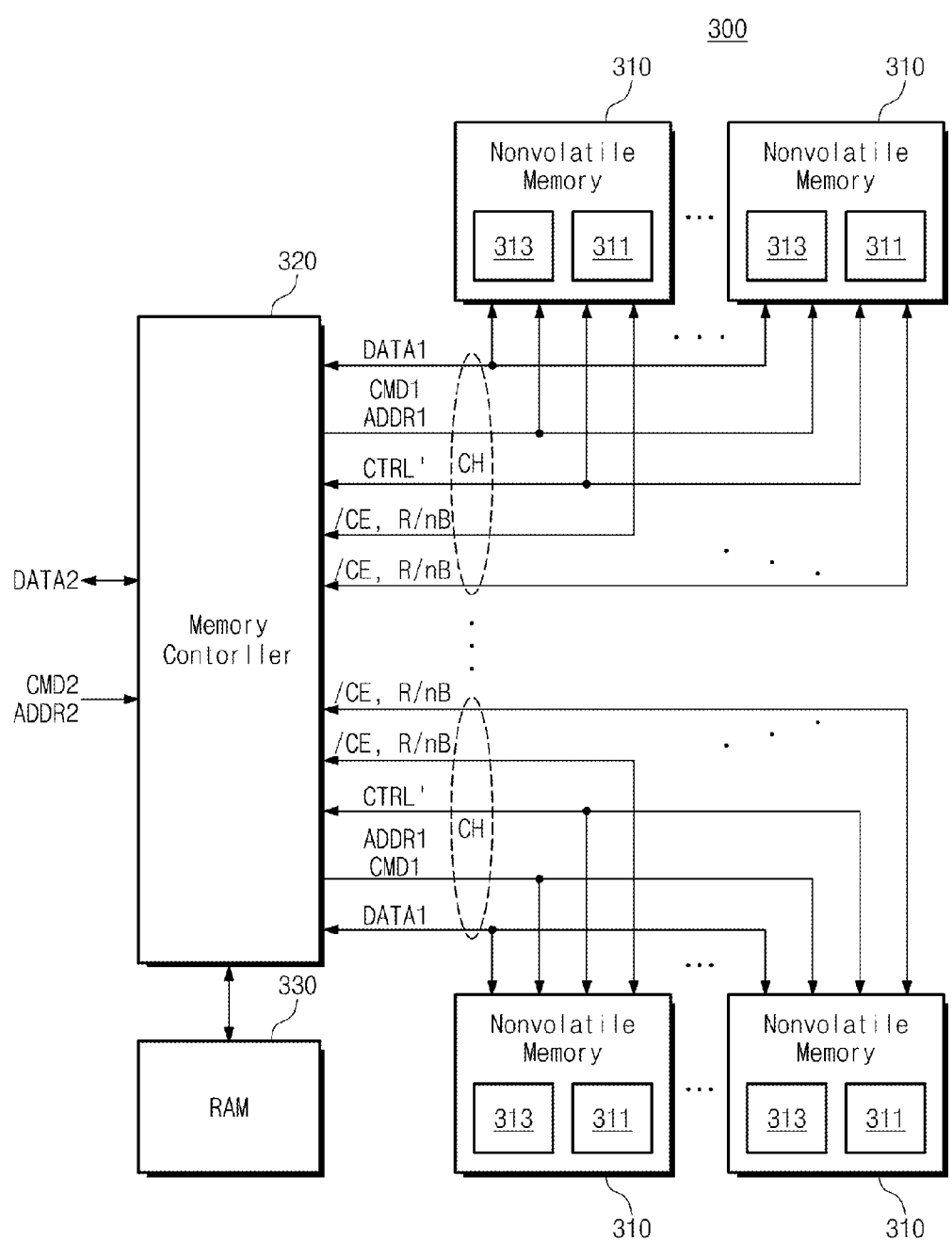
FIG. 16 is a block diagram schematically illustrating a storage device according to a third embodiment of the present disclosure.

FIG. 16 is a block diagram schematically illustrating a storage device 300 according to a third embodiment of the present disclosure. Referring to FIG. 16, a storage device 300 may contain a plurality of nonvolatile memories 310, a memory controller 320, and a RAM 330. Each of the plurality of nonvolatile memories 310 may contain a plurality of nonvolatile memory devices 311 and a retiming circuit 313. Each of the plurality of nonvolatile memories 310 may have the same structure as the nonvolatile memory 110 described with reference to FIGS. 2 through 14, and may operates in the same way as the nonvolatile memory 110. The retiming circuit 313 may perform a retiming operation between the plurality of nonvolatile memory devices 311 and the memory controller 320.

The plurality of nonvolatile memories 310 may communicate with the memory controller 320 through a plurality of channels CH. The plurality of nonvolatile memories 310 may independently communicate with the memory controller 320 by the channel. In each of the plurality of channels CH, the memory controller 320 may exchange first data DATA1, a first command CMD1, and a first address ADDR1 with the plurality of nonvolatile memories 310 through a common channel. In each of the plurality of channels CH, the memory controller 320 may exchange a control signal CTRL' with the plurality of nonvolatile memories 310 through the common channel. The control signal CTRL' may include a command latch enable signal CLE, an address latch enable signal ALE, a read enable signal /RE, a write enable signal /WE, and a write protection signal /WP.

In each of the plurality of channels CH, a chip enable signal /CE and a ready/busy signal R/nB may be exchanged between the memory controller 320 and the plurality of nonvolatile memories 310 through different channels. In each of the plurality of channels CH, the memory controller 320 may control the chip enable signal /CE such that the plurality of nonvolatile memories 310 or the plurality of nonvolatile memory devices 311 in each of the plurality of nonvolatile memories 310 can be independently selected. Also, in each of the plurality of channels CH, the memory controller 320 may identify whether the plurality of nonvolatile memories 310 and the plurality of nonvolatile memory devices 311 in each of the plurality of nonvolatile memories 310 are at a communication-possible state, based on the ready/busy signal R/nB.

Figure 17:
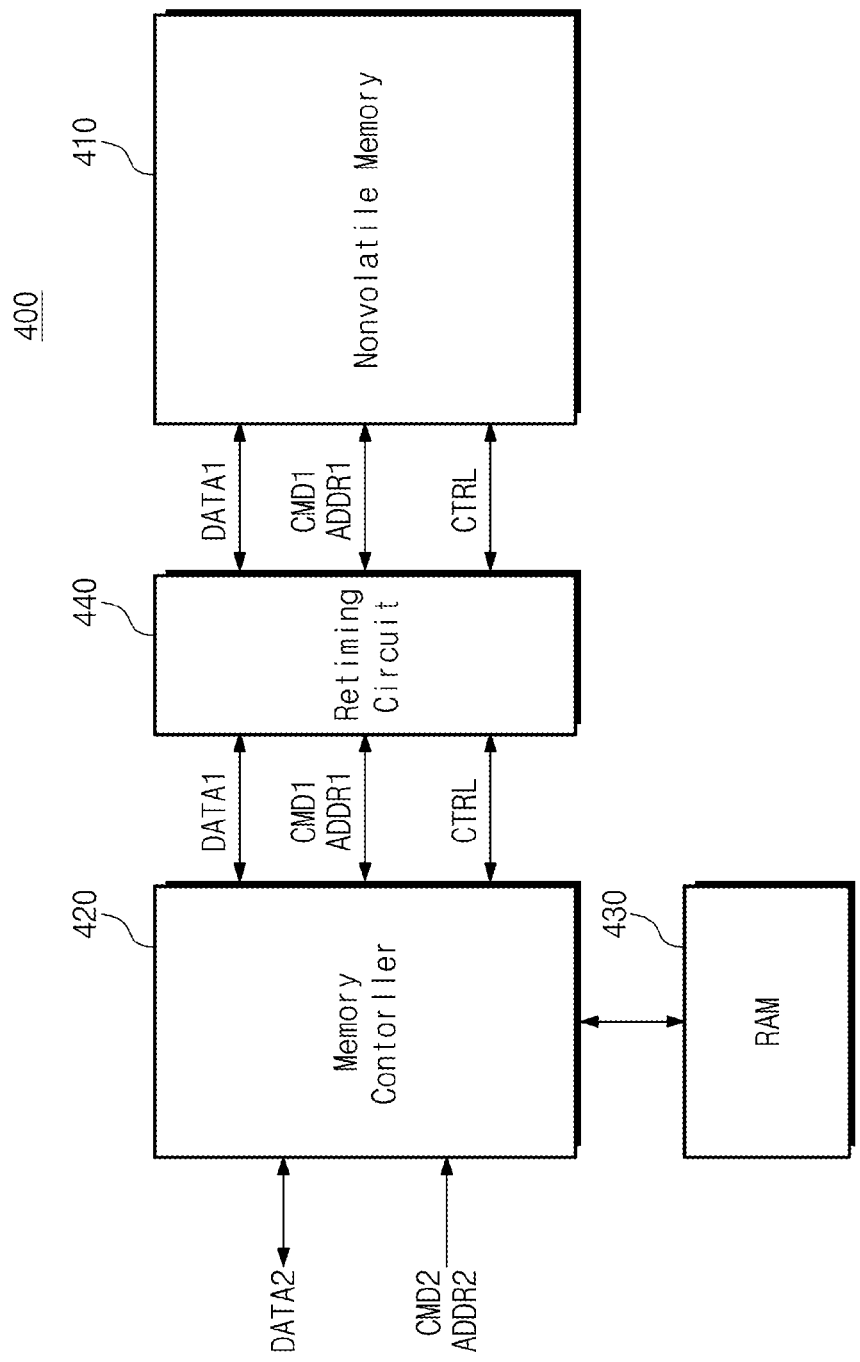
FIG. 17 is a block diagram schematically illustrating a storage device according to a fourth embodiment of the present disclosure.

FIG. 17 is a block diagram schematically illustrating a storage device 400 according to a fourth embodiment of the present disclosure. Referring to FIG. 17, the storage device 400 may contain a nonvolatile memory 410, a memory controller 420, a RAM 430, and a retiming circuit 440. As compared to the storage device 100 described with reference to FIG. 1, the retiming circuit 400 may be disposed outside the nonvolatile memory 410. The retiming circuit 410 may rearrange first data DATA1 between the nonvolatile memory 410 and the memory controller 420.

The nonvolatile memory 410 may be formed of a plurality of nonvolatile memory devices. The retiming circuit 400 may be configured to communicate with the plurality of nonvolatile memory devices.

Figure 18:
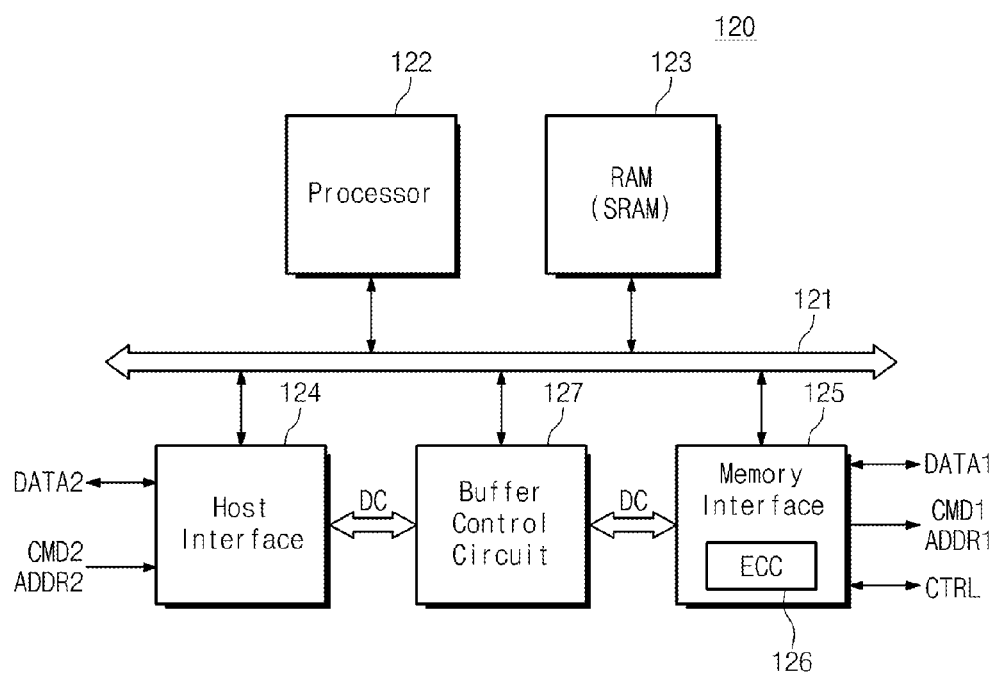
FIG. 18 is a block diagram schematically illustrating a memory controller according to an embodiment of the present disclosure.

FIG. 18 is a block diagram schematically illustrating a memory controller 120 according to an embodiment of the present disclosure. Referring to FIG. 18, the memory controller 120 may contain a bus 121, a processor 122, a RAM 123, a host interface 124, a memory interface 125, and a buffer control circuit 127.

The bus 121 may be configured to provide a channel among components of the memory controller 120. For example, a second command CMD2 and a second address ADDR2 that are provided from an external host device to the memory controller 120 may be transferred to the processor 122 through the bus 121. The processor 122 may produce a first command CMD1 and a first address ADDR1, based on the second command CMD2 and the second address ADDR2. The first command CMD1 and the first address ADDR1 may be transferred to the memory interface 125 through the bus 121. That is, the bus 121 may provide a path through which a command and an address are transferred among the host interface 124, the processor 122, and the memory interface 125. Also, the bus 121 may provide a control channel that enables the processor 122 in order to control the host interface 124, the memory interface 125, and the buffer control circuit 127. The bus 121 may also provide an access channel that enables the processor 122 in order to access the RAM 123.

The processor 122 may control an overall operation of the memory controller 120 and may execute a logical operation. The processor 122 may communicate with the external host device through the host interface 124. The processor 122 may store, in the RAM 123, the second command CMD2 or the second address ADDR2 received through the host interface 124. The processor 122 may produce a first command CMD1 and a first address ADDR1 according to a command or an address stored in the RAM 123. The processor 122 may output the first command CMD1 and the first address ADDR1 through the memory interface 125.

For example, the second address ADDR2 may be a logical address that is used in a host device, and the first address ADDR1 may be a physical address that is used in a nonvolatile memory 110. The processor 122 may load information, which is used to convert the second address ADDR2 into the first address ADDR1, on the RAM 123, and may refer to the information loaded on the RAM 123.

Under a control of the processor 122, data received through the host interface 124 may be output through the buffer control circuit 127. The data received through the buffer control circuit 127 may be transferred to the memory interface 125 under the control of the processor 122. The data received through the memory interface 125 may be output through the buffer control circuit 127 according to the control of the processor 122. Under the control of the processor 122, the data received through the buffer control circuit 127 may be output through the host interface 124 or through the memory interface 125.

The RAM 123 may be used as a working memory, a cache memory, or a buffer memory of the processor 122. The RAM 123 may store codes or instructions that the processor 122 will execute. The RAM 123 may store data processed by the processor 122. The RAM 123 may include an SRAM.

The host interface 124 may communicate with the external host according to the control of the processor 122. The host interface 124 may communicate using at least one of various communication manners such as Universal Serial Bus (USB), Serial AT Attachment (SATA), High Speed Interchip (HSIC), Small Computer System Interface (SCSI), Firewire, Peripheral Component Interconnection (PCI), PCI express (PCIe), NonVolatile Memory express (NVMe), Universal Flash Storage (UFS), Secure Digital (SD), MultiMedia Card (MMC), embedded MMC (eMMC), and so on.

The host interface 124 may transfer the second command CMD2 and the second address ADDR2 received from the host device to the processor 122 through the bus 121. The host interface 124 may transmit the second data DATA2 received from the host device to the buffer control circuit 127 through a data channel DC. The host interface 124 may output the second data DATA2 received from the buffer control circuit 127 to the host device.

The memory interface 125 may be configured to communicate with the nonvolatile memory 110 according to the control of the processor 122. The memory interface 125 may receive the first command CMD1 and the first address ADDR1 from the processor 122 through the bus 121. The memory interface 125 may output the first command CMD1 and the first address ADDR1 to the nonvolatile memory 110. Also, the memory interface 125 may produce a control signal CTRL using the first command CMD1 and the first address ADDR1, and may output the control signal CTRL to the nonvolatile memory 110.

The memory interface 125 may receive the first data DATA1 from the buffer control circuit 127 through a data channel DC. The memory interface 125 may output the first data DATA1 received through the data channel DC to the nonvolatile memory 110. The memory interface 125 may receive the control signal CTRL and the first data DATA1 from the nonvolatile memory 110. The memory interface 125 may transmit the first data DATA1 received from the nonvolatile memory 110 to the buffer control circuit 127 through the data channel DC.

The memory interface 125 may contain an error correction code (ECC) block 126. The ECC block 126 may perform an error correction operation. The ECC block 126 may generate parity for error correction, based on data to be output to the nonvolatile memory 110 through the memory interface 125. Data and parity may be written at the nonvolatile memory 110. When the first data DATA1 is received from the nonvolatile memory 110, parity associated with the first data DATA1 may be also received. The ECC block 126 may correct an error of the first data DATA1 using the first data DATA1 and the parity that are received through the memory interface 125.

The buffer control circuit 127 may be configured to control the RAM 123 according to the control of the processor 122. The buffer control circuit 127 may write data at the RAM 123 and may read data from the RAM 123.

In exemplary embodiments, the processor 122 may control the memory controller 120 using codes. The processor 122 may read codes from a nonvolatile memory (e.g., read only memory) that is implemented in the memory controller 120, and may store the read codes at the RAM 123 for execution. Or, the processor 122 may store codes received through the memory interface 125 at the RAM 123 for execution.

In exemplary embodiments, the memory interface 125 or the processor 122 may further perform randomization on the first data DATA1 to be written at the nonvolatile memory 110. Randomization may be an operation of coding the first data DATA1 randomly or according to a predetermined rule, thereby preventing a specific pattern from being generated in the first data DATA1. Also, the memory interface 125 or the processor 122 may perform de-randomization on the first data DATA1 read from the nonvolatile memory 110.

In exemplary embodiments, the memory interface 125 or the processor 122 may further perform encryption in order to improve security of the first data DATA1 to be written at the nonvolatile memory 110. The memory interface 125 or the processor 122 may further perform decryption on the first data DATA1 read from the nonvolatile memory 110. The encryption and decryption may be made according to the standardized protocols such as Data Encryption Standard (DES), Advanced Encryption Standard (AES), and so on.

In exemplary embodiments, the memory controller 120 may be configured to provide an auxiliary power. For example, the memory controller 120 may store power supplied from a host device at a storing place such as a super cap. At sudden power-off, the memory controller 120 may back up an operating state of the memory controller 120 or may write data that is not yet stored in the nonvolatile memory 110, using the auxiliary power. The memory controller 120 may perform a normal power-off sequence using the auxiliary power.

Figure 19:
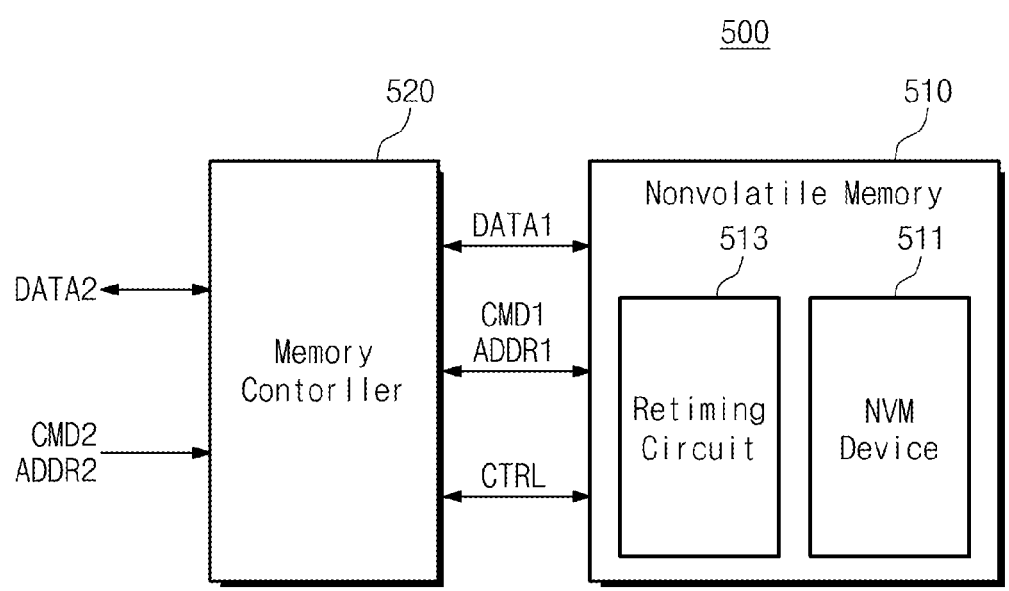
FIG. 19 is a block diagram schematically illustrating a storage device according to a fifth embodiment of the present disclosure.

FIG. 19 is a block diagram schematically illustrating a storage device 500 according to a fifth embodiment of the present disclosure. Referring to FIG. 19, a storage device 500 may comprise a nonvolatile memory 510 and a memory controller 520. The nonvolatile memory 510 may contain a nonvolatile memory device 511 and a retiming circuit 513.

The storage device 500 may be different from a storage device 100 shown in FIG. 1. The storage device 500 may not include a RAM. The memory controller 520 may operate using an internal RAM instead of an external RAM.

Figure 20:
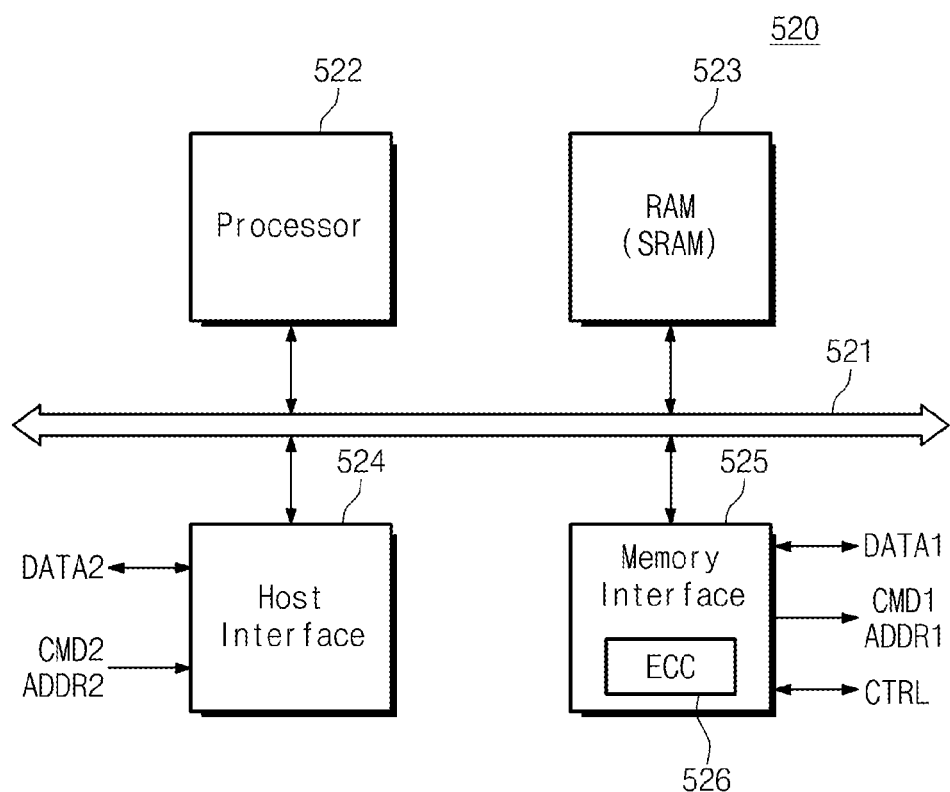
FIG. 20 is a block diagram schematically illustrating a memory controller according to an embodiment of the present disclosure.

FIG. 20 is a block diagram schematically illustrating a memory controller 520 according to an embodiment of the present disclosure. Referring to FIG. 20, a memory controller 520 may contain a bus 521, a processor 522, a RAM 523, a host interface 524, and a memory interface 525.

The bus 521 may be configured to provide a channel among components of the memory controller 520.

The processor 522 may control an overall operation of the memory controller 120 and may execute a logical operation. The processor 522 may communicate with the external host device through the host interface 524. The processor 522 may store, in the RAM 523, the second command CMD2 or the second address ADDR2 received through the host interface 524. The processor 522 may produce a first command CMD1 and a first address ADDR1 according to a command or an address stored in the RAM 523. The processor 522 may output the first command CMD1 and the first address ADDR1 through the memory interface 525.

For example, the second address ADDR2 may be a logical address that is used in a host device, and the first address ADDR1 may be a physical address that is used in a nonvolatile memory 510. The processor 522 may load information, which is used to convert the second address ADDR2 into the first address ADDR1, in the RAM 523, and may refer to the information loaded in the RAM 523.

The processor 522 may store the second data DATA2 received through the host interface 524, in the RAM 523. The processor 522 may transmit data stored in the RAM 523 to the memory interface 525 as the first data DATA1. The processor 522 may store, in the RAM 523, the first data DATA1 received through the memory interface 525. The processor 522 may output data stored in the RAM 523 through the host interface 524 as the second data DATA2.

The RAM 523 may be used as a working memory, a cache memory, or a buffer memory of the processor 522. The RAM 523 may store codes or instructions that the processor 522 will execute. The RAM 523 may store data processed by the processor 522. The RAM 523 may store the first data DATA1 to be written at the nonvolatile memory 510 or the first data DATA1 read from the nonvolatile memory 510. The RAM 523 may include an SRAM.

The host interface 524 may communicate with the external host according to a control of the processor 522. The host interface 524 may communicate using at least one of various communication manners such as Universal Serial Bus (USB), Serial AT Attachment (SATA), High Speed Interchip (HSIC), Small Computer System Interface (SCSI), Firewire, Peripheral Component Interconnection (PCI), PCI express (PCIe), NonVolatile Memory express (NVMe), Universal Flash Storage (UFS), Secure Digital (SD), MultiMedia Card (MMC), embedded MMC (eMMC), and so on.

The host interface 524 may transfer the second command CMD2 and the second address ADDR2 received from the host device to the processor 522 through the bus 521. The host interface 524 may transmit the second data DATA2 received from the host device to the RAM 523 through the bus 521. The host interface 524 may output the second data DATA2 received from the RAM 523 through the bus 521 to the host device.

The memory interface 525 may be configured to communicate with the nonvolatile memory 510 according to a control of the processor 522. The memory interface 525 may receive the first command CMD1 and the first address ADDR1 from the processor 522 through the bus 121. The memory interface 525 may output the first command CMD1 and the first address ADDR1 to the nonvolatile memory 510. Also, the memory interface 525 may produce a control signal CTRL using the first command CMD1 and the first address ADDR1, and may output the control signal CTRL to the nonvolatile memory 510.

The memory interface 525 may receive the first data DATA1 from the RAM 523 through the bus 521. The memory interface 125 may output the first data DATA1 received through the bus 521 to the nonvolatile memory 510. The memory interface 525 may receive the control signal CTRL and the first data DATA1 from the nonvolatile memory 510. The memory interface 525 may transmit the first data DATA1 received from the nonvolatile memory 510 to the RAM 523 through the bus 521.

The memory interface 525 may contain an ECC block 526. The ECC block 526 may perform an error correction operation. The ECC block 526 may generate parity for error correction, based on data to be output to the nonvolatile memory 510 through the memory interface 525. Data and parity may be written together at the nonvolatile memory 510. When the first data DATA1 is received from the nonvolatile memory 510, parity associated with the first data DATA1 may be also received. The ECC block 526 may correct an error of the first data DATA1 using the first data DATA1 and associated parity that are received through the memory interface 525.

In exemplary embodiments, the processor 522 may control the memory controller 520 using codes. The processor 522 may read codes from a nonvolatile memory (e.g., read only memory) that is implemented in the memory controller 520 and may store the read codes at the RAM 523 for execution. Or, the processor 522 may store codes received through the memory interface 525 at the RAM 523 for execution.

In exemplary embodiments, the memory interface 525 or the processor 522 may further perform randomization on the first data DATA1 to be written at the nonvolatile memory 510. Randomization may be an operation of coding the first data DATA1 randomly or according to a predetermined rule, thereby preventing a specific pattern from being generated in the first data DATA1. Also, the memory interface 525 or the processor 522 may perform de-randomization on the first data DATA1 read from the nonvolatile memory 510.

In exemplary embodiments, the memory interface 525 or the processor 522 may further perform encryption in order to improve security of the first data DATA1 to be written at the nonvolatile memory 510. The memory interface 525 or the processor 522 may further perform decryption on the first data DATA1 read from the nonvolatile memory 510. The encryption and decryption may be made according to the standardized protocols such as Data Encryption Standard (DES), Advanced Encryption Standard (AES), and so on.

In exemplary embodiments, the memory controller 520 may be configured to provide an auxiliary power. For example, the memory controller 520 may store power supplied from a host device at a storing place such as a super cap. At sudden power-off, the memory controller 520 may back up an operating state of the memory controller 520 or may write data that is not yet stored in the nonvolatile memory 510, using the auxiliary power. The memory controller 520 may perform a normal power-off sequence using the auxiliary power.

Figure 21:
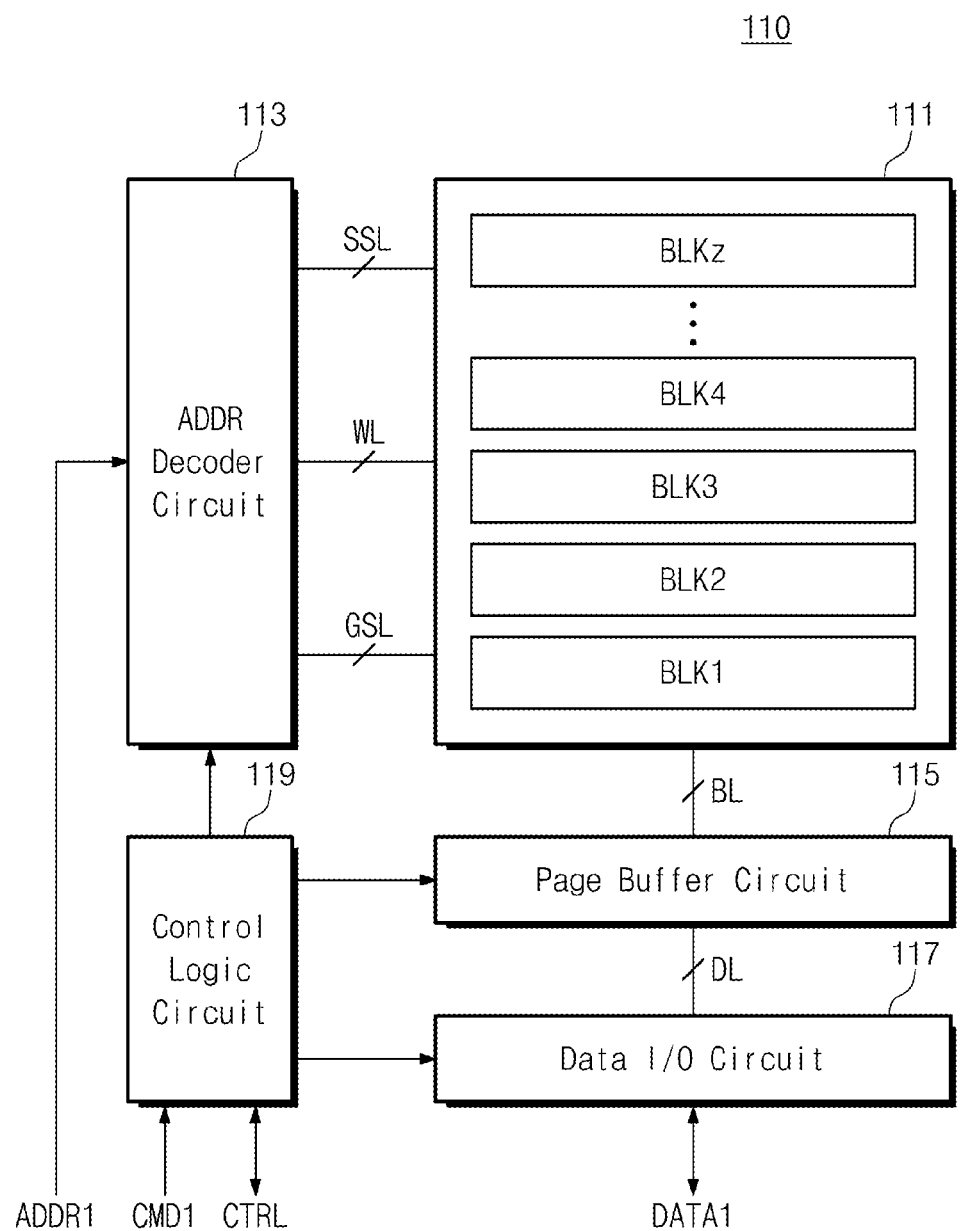
FIG. 21 is a block diagram schematically illustrating a nonvolatile memory according to an embodiment of the present disclosure.

FIG. 21 is a block diagram schematically illustrating a nonvolatile memory 110 according to an embodiment of the present disclosure. Referring to FIG. 21, a nonvolatile memory 110 may include a memory cell array 111, an address decoder circuit 113, a page buffer circuit 115, a data input/output circuit 117, and a control logic circuit 119.

The memory cell array 111 may include a plurality of memory blocks BLK1 through BLKz. Each of the plurality of memory blocks BLK1 through BLKz may have a plurality of memory cells. Each of the plurality of memory blocks BLK1 through BLKz may be connected to the address decoder circuit 113 through at least one string selection line SSL, a plurality of word lines WL, and at least one ground selection line GSL. Each of the plurality of memory blocks BLK1 through BLKz may be connected to the page buffer circuit 115 through a plurality of bit lines BL. The plurality of memory blocks BLK1 through BLKz may be connected in common to the plurality of bit lines BL. Memory cells of the plurality of memory blocks BLK1 through BLKz may have the same structure. In exemplary embodiments, each of the plurality of memory blocks BLK1 through BLKz may be a unit of an erase operation. An erase operation may be carried out by the memory block. Memory cells of a memory block may be erased at the same time.

The address decoder circuit 113 may be connected to the memory cell array 111 through a plurality of ground selection lines GSL, the plurality of word lines WL, and a plurality of string selection lines SSL. The address decoder circuit 113 may operate in response to a control of the control logic circuit 119. The address decoder circuit 113 may receive a first address ADDR1 from a memory controller 120. The address decoder circuit 113 may decode the first address ADDR1 and may control voltages to be applied to the plurality of word lines WL according to the decoded address.

For example, at programming, the address decoder circuit 113 may apply a program voltage to a selected word line of a selected memory block that the first address ADDR1 points out. The address decoder circuit 113 may also apply a pass voltage to unselected word lines of the selected memory block. At reading, the address decoder circuit 113 may apply a selection read voltage to a selected word line of a selected memory block that the first address ADDR1 points out. The address decoder circuit 113 may also apply a non-selection read voltage to unselected word lines of the selected memory block. At erasing, the address decoder circuit 113 may apply an erase voltage (e.g., ground voltage) to word lines of a selected memory block that the first address ADDR1 points out.

The page buffer circuit 115 may be connected to the memory cell array 111 through the plurality of bit lines BL. The page buffer circuit 115 may be connected to the data input/output circuit 117 through a plurality of data lines DL. The page buffer circuit 115 may operate in response to the control of the control logic circuit 119.

The page buffer circuit 115 may hold data to be programmed at memory cells of the memory cell array 111 or data read from memory cells thereof. During a program operation, the page buffer circuit 115 may store data to be stored in memory cells. The page buffer circuit 115 may bias the plurality of bit lines BL based on the stored data. The page buffer circuit 115 may function as a write driver at a program operation. During a read operation, the page buffer circuit 115 may sense voltages of the plurality of bit lines BL, and may store the sensed results. The page buffer circuit 115 may function as a sense amplifier at a read operation.

The data input/output circuit 117 may be connected to the page buffer circuit 115 through the data lines DL. The data input/output circuit 117 may exchange first data DATA1 with the memory controller 120.

The data input/output circuit 117 may temporarily store first data DATA1 the memory controller 120 provides, and the data input/output circuit 117 may transfer the temporarily stored data to the page buffer circuit 115. The data input/output circuit 117 may temporarily store data transferred from the page buffer circuit 115, and may transfer the data to the memory controller 120. The data input/output circuit 117 may function as a buffer memory.

The control logic circuit 119 may receive a first command CMD1 and a control signal CTRL from the memory controller 120. The control logic circuit 119 may decode the first command CMD1 that is received, and may control an overall operation of the nonvolatile memory 110 according to the decoded command.

In exemplary embodiments, the control logic circuit 119 may contain a delay locked loop DLL according to an embodiment of the present disclosure. At a read operation, the control logic circuit 119 may detect a locking delay from a read enable signal /RE of a control signal CTRL, and may output a data strobe signal DQS using the detected locking delay and the read enable signal /RE. At a write operation, the control logic circuit 119 may detect the locking delay from the data strobe signal DQS of the control signal CTRL, and may output the data strobe signal DQS using the detected locking delay and the data strobe signal DQS.

Figure 22:
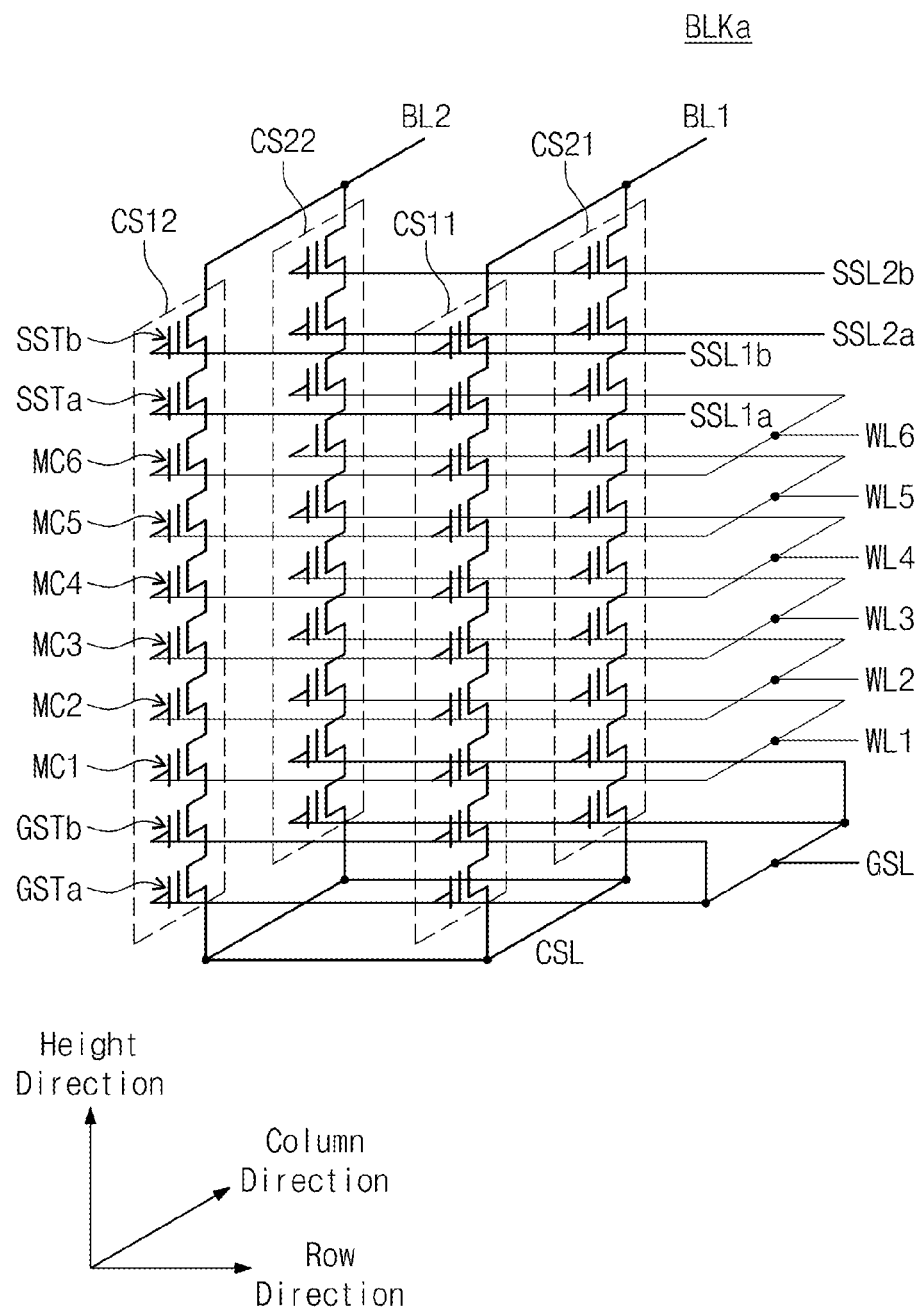
FIG. 22 is a circuit diagram schematically illustrating a memory block according to an embodiment of the present disclosure.

FIG. 22 is a circuit diagram schematically illustrating a memory block BLKa according to an embodiment of the present disclosure. Referring to FIG. 22, a memory block BLKa may include a plurality of cell strings CS11 through CS21 and CS12 through CS22. The plurality of cell strings CS11 through CS21 and CS12 through CS22 may be arranged along a row direction and a column direction, and may form rows and columns.

For example, the cell strings CS11 and CS12 arranged along the row direction may form a first row, and the cell strings CS21 and CS22 arranged along the row direction may form a second row. The cell strings CS11 and CS21 arranged along the column direction may form a first column, and the cell strings CS12 and CS22 arranged along the column direction may form a second column.

Each of the plurality of cell strings CS11 through CS21 and CS12 through CS22 may contain a plurality of cell transistors. The plurality of cell transistors may include ground selection transistors GSTa and GSTb, memory cells MC1 through MC6, and string selection transistors SSTa and SSTb. The ground selection transistors GSTa and GSTb, the memory cells MC1 through MC6, and the string selection transistors SSTa and SSTb of each cell string may be stacked in a height direction perpendicular to a plane (e.g., plane above a substrate of the memory block BLKa) on which the plurality of cell strings CS11 through CS21 and CS12 through CS22 are arranged along rows and columns.

Each cell transistor may be formed of a charge trap type cell transistor of which the threshold voltage varies with the amount of charge trapped in its insulation layer.

Lowermost ground selection transistors GSTa may be connected in common to a common source line CSL.

The ground selection transistors GSTa and GSTb of the plurality of cell strings CS11 through CS21 and CS12 through CS22 may be connected in common to a ground selection line GSL.

In exemplary embodiments, the ground selection transistors with the same height (or, order) may be connected to the same ground selection line, and the ground selection transistors with different heights (or, orders) may be connected to different ground selection lines. For example, the ground selection transistors GSTa with a first height may be connected in common to a first ground selection line, and the ground selection transistors GSTb with a second height may be connected in common to a second ground selection line.

In exemplary embodiments, the ground selection transistors in the same row may be connected to the same ground selection line, and the ground selection transistors in different rows may be connected to different ground selection lines. For example, the ground selection transistors GSTa and GSTb of the cell strings CS11 and CS12 in the first row may be connected in common to the first ground selection line, and the ground selection transistors GSTa and GSTb of the cell strings CS21 and CS22 in the second row may be connected in common to the second ground selection line.

Memory cells that are placed at the same height (or, order) from the substrate (or, the ground selection transistors GST) may be connected in common to a word line. Memory cells that are placed at different heights (or, orders) may be connected to different word lines WL1 through WL6. For example, the memory cells MC1 may be connected in common to the word line WL1, the memory cells MC2 may be connected in common to the word line WL2, and the memory cells MC3 may be connected in common to the word line WL3. The memory cells MC4 may be connected in common to the word line WL4, the memory cells MC5 may be connected in common to the word line WL5, and the memory cells MC6 may be connected in common to the word line WL6.

In first string selection transistors SSTa, having the same height (or, order), of the cell strings CS11 through CS21 and CS12 through CS22, the first string selection transistors SSTa in different rows may be connected to different string selection lines SSL1a and SSL2a. For example, the first string selection transistors SSTa of the cell strings CS11 and CS12 may be connected in common to the string selection line SSL1a, and the first string selection transistors SSTa of the cell strings CS21 and CS22 may be connected in common to the string selection line SSL2a.

In second string selection transistors SSTb, having the same height (or, order), of the cell strings CS11 through CS21 and CS12 through CS22, the second string selection transistors SSTb in different rows may be connected to the different string selection lines SSL1a and SSL2a. For example, the second string selection transistors SSTb of the cell strings CS11 and CS12 may be connected in common to the string selection line SSL1b, and the second string selection transistors SSTb of the cell strings CS21 and CS22 may be connected in common to the string selection line SSL2b.

That is, the cell strings in different rows may be connected to different string selection lines. The string selection transistors, having the same height (or, order), of the cell strings in the same row may be connected to the same string selection line. The string selection transistors, having different heights (or, orders), of the cell strings in the same row may be connected to different string selection lines.

In exemplary embodiments, the string selection transistors of the cell strings in the same row may be connected in common to a string selection line. For example, the string selection transistors SSTa and SSTb of the cell strings CS11 and CS12 in the first row may be connected in common to a string selection line, and the string selection transistors SSTa and SSTb of the cell strings CS21 and CS22 in the second row may be connected in common to a string selection line.

Columns of the plurality of cell strings CS11 through CS21 and CS12 through CS22 may be connected to different bit lines BL1 and BL2. For example, the string selection transistors SSTb of the cell strings CS11 and CS21 in the first column may be connected in common to the bit line BL1, and the string selection transistors SSTb of the cell strings CS12 and CS22 in the second column may be connected in common to the bit line BL2.

The cell strings CS11 and CS12 may form a first plane, and the cell strings CS21 and CS22 may form a second plane.

A write operation and a read operation of the memory block BLKa may be performed by the row. For example, one plane may be selected by the string selection lines SSL1a, SSL1b, SSL2a, and SSL2b. Cell strings CS11 and CS12 of the first plane may be connected to the bit lines BL1 and BL2 when a turn-on voltage is applied to the string selection lines SSL1a and SSL1b and a turn-off voltage is supplied to the string selection lines SSL2a and SSL2b. That is, the first plane may be selected. Cell strings CS21 and CS22 of the second plane may be connected to the bit lines BL1 and BL2 when the turn-on voltage is applied to the string selection lines SSL2a and SSL2b and the turn-off voltage is supplied to the string selection lines SSL1a and SSL1b. That is, the second plane may be selected. In a selected plane, a row of memory cells may be selected by word lines WL1 to WL6. The read operation or the write operation may be performed with respect to the selected row.

An erase operation on the memory block BLKa may be performed by the block or by the sub block. All of memory cells of a memory block BLKa may be erased when the erase operation is performed by the memory block. When the erase operation is performed by the sub block, a part of memory cells of the memory block BLKa may be erased and the rest thereof may be erase-inhibited. A low voltage (e.g., ground voltage) may be supplied to a word line connected to memory cells to be erased, and a word line connected to memory cells to be erase-inhibited may be floated.

The memory block BLKa shown in FIG. 22 is exemplary. However, the present disclosure is not limited thereto. For example, the number of rows of cell strings may increase or decrease. If the number of rows of cell strings is changed, the number of string or ground selection lines and the number of cell strings connected to a bit line may also be changed.

The number of columns of cell strings may increase or decrease. If the number of columns of cell strings is changed, the number of bit lines connected to columns of cell strings and the number of cell strings connected to a string selection line may also be changed.

A height of the cell strings may increase or decrease. For example, the number of ground selection transistors, memory cells, or string selection transistors that are stacked in each cell string may increase or decrease.

Figure 23:
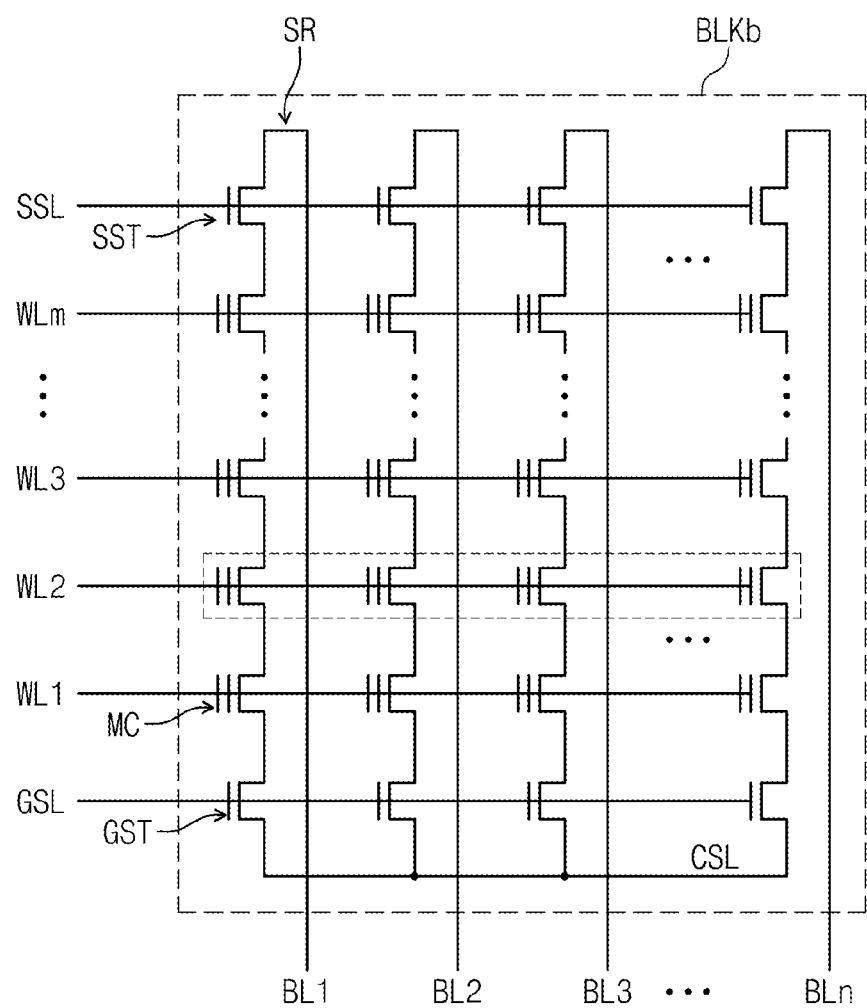
FIG. 23 is a circuit diagram schematically illustrating a memory block according to another embodiment of the present disclosure.

FIG. 23 is a circuit diagram schematically illustrating a memory block BLKb according to another embodiment of the present disclosure. Referring to FIG. 23, a memory block BLKb may include a plurality of strings SR, which are connected to a plurality of bit lines BL1 through BLn. Each of the plurality of strings SR may contain a ground selection transistor GST, memory cells MC, and a string selection transistor SST.

In each of the plurality of strings SR, the ground selection transistor GST may be connected between the memory cells MC and a common source line CSL. The ground selection transistors GST of the plurality of strings SR may be connected in common to the common source line CSL.

In each of the plurality of strings SR, the string selection transistor SST may be connected between the memory cells MC and a bit line BL. The string selection transistors SST of the plurality of strings SR may be connected to a plurality of bit lines BL1 through BLn.

In each of the plurality of strings SR, the plurality of memory cells MC may be connected between the ground selection transistor GST and the string selection transistor SST. In each of the plurality of strings SR, the plurality of memory cells MC may be connected in series.

In the plurality of strings SR, memory cells MC having the same height from the common source line CSL may be connected in common to a word line. The memory cells MC of the plurality of strings SR may be connected to a plurality of word lines WL1 through WLm.

In the memory block BLKb, an erase operation may be performed by the memory block. When the erase operation is performed by the memory block, all memory cells of the memory block BLKb may be simultaneously erased according to an erase request.

Figure 24:
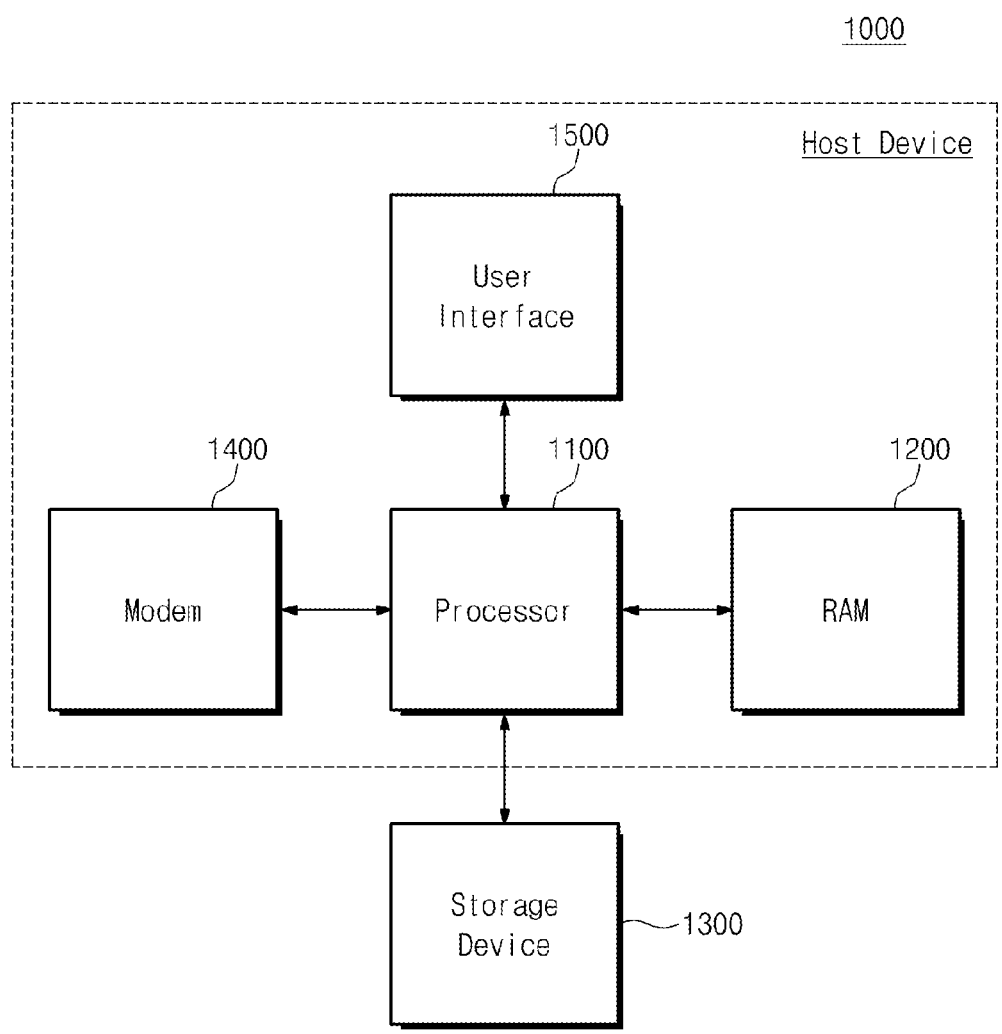
FIG. 24 is a block diagram schematically illustrating a computing device according to an embodiment of the present disclosure.

FIG. 24 is a block diagram schematically illustrating a computing device 1000 according to an embodiment of the present disclosure. Referring to FIG. 24, a computing device 1000 may include a processor 1100, a RAM 1200, a storage device 1300, a modem 1400, and a user interface 1500.

The processor 1100 may control an overall operation of the computing device 1000 and may perform a logical operation. The processor 1100 may be formed of a system-on-chip (SoC). The processor 1100 may be a general purpose processor, a specific-purpose processor, or an application processor.

The RAM 1200 may communicate with the processor 1100. The RAM 1200 may be a main memory of the processor 1100 or the computing device 1000. The processor 1100 may store codes or data in the RAM 1200 temporarily. The processor 1100 may execute the codes using the RAM 1200 to process the data. The processor 1100 may execute a variety of software, such as, but not limited to, an operating system and an application, using the RAM 1200. The processor 1100 may control the overall operation of the computing device 1000 using the RAM 1200. The RAM 1200 may include a volatile memory such as, but not limited to, a static RAM (SRAM), a dynamic RAM (DRAM), a synchronous DRAM (SDRAM) and so on, or a nonvolatile memory such as, but not limited to, a Phase-change RAM (PRAM), a Magnetic RAM (MRAM), a Resistive RAM (RRAM), a Ferroelectric RAM (FRAM) and so on.

The storage device 1300 may communicate with the processor 1100. The storage device 1300 may be used to store data for a long time. That is, the processor 110 may store data, which is to be stored for a long time, in the storage device 1300. The storage device 1300 may store a boot image for driving the computing device 1000. The storage device 1300 may store source codes of a variety of software, such as the operating system and the application. The storage device 1300 may store data that is processed by a variety of software, such as the operating system and the application.

In exemplary embodiments, the processor 1100 may load source codes stored in the storage device 1300 on the RAM 1200. The codes loaded on the RAM 1200 may be executed to run a variety of software, such as the operating system, the application, and so on. The processor 1100 may load data stored in the storage device 1300 on the RAM 1200 and may process the data loaded on the RAM 1200. The processor 1100 may store long-term data of the data stored in the RAM 1200 at the storage device 1300.

The storage device 1300 may include a nonvolatile memory, such as, but not limited to, a flash memory, a Phase-change RAM (PRAM), a Magnetic RAM (MRAM), a Resistive RAM (RRAM), a Ferroelectric RAM (FRAM), and so on.

The modem 1400 may communicate with an external device according to a control of the processor 1100. For example, the modem 1400 may communicate with the external device in a wire or wireless manner. The modem 1400 may communicate with the external device, based on at least one of wireless communications manners such as Long Term Evolution (LTE), WiMax, Global System for Mobile communication (GSM), Code Division Multiple Access (CDMA), Bluetooth, Near Field Communication (NFC), WiFi, Radio Frequency Identification (RFID) and so on, or wire communications manners such as Universal Serial Bus (USB), Serial AT Attachment (SATA), High Speed Interchip (HSIC), Small Computer System Interface (SCSI), Firewire, Peripheral Component Interconnection (PCI), PCI express (PCIe), NonVolatile Memory express (NVMe), Universal Flash Storage (UFS), Secure Digital (SD), Secure Digital Input Output (SDIO), Universal Asynchronous Receiver Transmitter (UART), Serial Peripheral Interface (SPI), High Speed SPI (HS-SPI), RS232, Inter-integrated Circuit (I2C), HS-I2C, Integrated-interchip Sound (I2S), Sony/Philips Digital Interface (S/PDIF), MultiMedia Card (MMC), embedded MMC (eMMC), and so on.

The user interface 1500 may communicate with a user according to a control of the processor 1100. For example, the user interface 1500 may include user input interfaces such as a keyboard, a keypad, a button, a touch panel, a touch screen, a touch pad, a touch ball, a camera, a microphone, a gyroscope sensor, a vibration sensor, and so on. The user interface 1500 may further include user output interfaces such as an LCD, an Organic Light Emitting Diode (OLED) display device, an Active Matrix OLED (AMOLED) display device, an LED, a speaker, a motor, and so on.

The storage device 1300 may include at least one of storage devices 100, 200, 300, 400, and 500 according to embodiments of the present disclosure. The processor 1100, the RAM 1200, the modem 1400, and the user interface 1500 may constitute a host device that communicates with the storage device 1300.

While the present disclosure has been described with reference to exemplary embodiments, it will be apparent to those skilled in the art that various changes and modifications may be made without departing from the spirit and scope of the present disclosure. Therefore, it should be understood that the above embodiments are not limiting, but illustrative.

What is claimed is:

1. A storage device comprising:
  a nonvolatile memory; and
  a memory controller configured to control the nonvolatile memory and configured to transmit a first timing signal to the nonvolatile memory at a read operation,
  wherein the nonvolatile memory comprises:
  a nonvolatile memory device configured to output read data and a second timing signal in response to the first timing signal; and
  a retiming circuit configured to detect a locking delay based on the first timing signal, configured to produce a third timing signal from the second timing signal using the detected locking delay, configured to retime the read data by latching the read data in synchronization with the third timing signal, and configured to output the third timing signal and the retimed read data to the memory controller.

2. The storage device of claim 1, wherein the retiming circuit comprises:
  a first timing reception node configured to receive the first timing signal from the memory controller;
  a first timing transmission node configured to transmit to the nonvolatile memory the first timing signal received through the first timing reception node;
  a second timing reception node configured to receive the second timing signal from the nonvolatile memory;
  a delay locked loop configured to detect the locking delay from the first timing signal received through the first timing reception node and configured to produce the third timing signal from the second timing signal received through the second timing reception node, using the detected locking delay; and
  a second timing transmission node configured to output the third timing signal to the memory controller.

3. The storage device of claim 2, wherein the retiming circuit further comprises:
  a data reception node configured to receive the read data;
  a flip-flop configured to receive and output the read data, received through the data reception node, in synchronization with the third timing signal output from the delay locked loop; and
  a data transmission node configured to output an output of the flip-flop to the memory controller as the retimed read data.

4. The storage device of claim 1, wherein the memory controller is further configured to transmit write data and a fourth timing signal to the nonvolatile memory, and
  the retiming circuit is further configured to detect a second locking delay from the fourth timing signal and to produce a fifth timing signal from the fourth timing signal using the second locking delay.

5. The storage device of claim 4, wherein the retiming circuit is further configured to retime the write data by latching the write data in synchronization with the fifth timing signal, and configured to output the fifth timing signal and the retimed write data to the nonvolatile memory.

6. The storage device of claim 5, wherein the retiming circuit comprises:
   a timing reception node configured to receive the fourth timing signal from the memory controller;
   a delay locked loop configured to detect the second locking delay from the fourth timing signal and configured to produce the fifth timing signal from the fourth timing signal using the second locking delay; and
   a timing transmission node configured to transmit the fifth timing signal to the nonvolatile memory.

7. The storage device of claim 6, wherein the retiming circuit further includes:
   a data reception node configured to receive the write data from the memory controller;
   a flip-flop configured to receive and output the write data in synchronization with the fifth timing signal; and
   a data transmission node configured to transmit an output of the flip-flop to the nonvolatile memory as the retimed write data.

8. The storage device of claim 5, wherein the retiming circuit comprises:
   a decoder configured to receive a control signal from the memory controller, to determine a read operation or write operation of the nonvolatile memory in response to the control signal, and to output an operating signal indicating the read operation or the write operation of the nonvolatile memory;
   a timing signal processing unit configured to receive the first, second and fourth timing signals from the memory controller and the nonvolatile memory, and configured to produce the third and fifth timing signals based on the first, second and fourth timing signals; and
   a data retiming unit configured to receive the read and write data from the memory controller and the nonvolatile memory, and configured to retime the read data and write data using the third and fifth timing signals.

9. The storage device of claim 8, wherein the timing signal processing unit comprises:
   a first timing reception node configured to receive the first timing signal from the memory controller;
   a first timing transmission node configured to transmit the first timing signal to the nonvolatile memory;
   a second timing reception node configured to receive the second timing signal from the nonvolatile memory;
   a third timing reception node configured to receive the fourth timing signal from the memory controller;
   a multiplexer configured to output the first timing signal and the second timing signal at a read operation, and configured to output the fourth timing signal at a write operation, in response to the operating signal;
   a delay locked loop configured to detect the locking delay from the first timing signal at the read operation, configured to produce the third timing signal from the second timing signal using the detected locking delay, configured to detect the second locking delay from the fourth timing signal at the write operation, and configured to produce the fifth timing signal from the fourth timing signal using the second locking delay;
   a second timing transmission node configured to transmit the third timing signal to the memory controller; and
   a third timing transmission node configured to transmit the fifth timing signal to the nonvolatile memory.

10. The storage device of claim 8, wherein the data retiming unit comprises:
    a first data reception node configured to receive the read data from the nonvolatile memory;
    a first flip-flop configured to receive and output the read data in synchronization with the third timing signal;
    a first data transmission node configured to transmit an output of the first flip-flop to the memory controller as the retimed read data;
    a second data reception node configured to receive the write data from the memory controller;
    a second flip-flop configured to receive and output the write data in synchronization with the fifth timing signal; and
    a second data transmission node configured to transmit an output of the second flip-flop to the nonvolatile memory as the retimed write data.

11. A storage device comprising:
    a nonvolatile memory including one or more nonvolatile memory device;
    a random access memory (RAM);
    a memory controller configured to control the nonvolatile memory and configured to transmit a first timing signal to the nonvolatile memory at a read operation; and
    a retiming circuit configured to detect a locking delay based on the first timing signal,
    wherein the one or more nonvolatile memory device is configured to output read data and a second timing signal in response to the first timing signal, and
    the retiming circuit is configured produce a third timing signal from the second timing signal using the detected locking delay, configured to retime the read data by latching the read data in synchronization with the third timing signal, and configured to output the third timing signal and the retimed read data to the memory controller.

12. The storage device of claim 11, wherein the retiming circuit includes:
    a timing signal processing circuit configured to receive the first and second timing signals, and configured to produce the third timing signal based on the first and second timing signals; and
    a data retiming circuit configured to receive the read data, and configured to retime the read data using the third timing signal.

13. The storage device of claim 11, wherein the retiming circuit includes a delay locked loop configured to detect the locking delay from the first timing signal, and configured to produce the third timing signal from the second timing signal, using the detected locking delay.

14. The storage device of claim 11, wherein the memory controller is configured to transmit write data and a fourth timing signal to the nonvolatile memory, and
    the retiming circuit is configured to detect a second locking delay from the fourth timing signal and to produce a fifth timing signal from the fourth timing signal using the second locking delay.

15. The storage device of claim 11, wherein the retimed read data is delayed from the read data as much as a quarter period of the third timing signal.

16. The storage device of claim 11, wherein the locking delay is detected while the first timing signal toggles two times.

17. The storage device of claim 11, wherein the nonvolatile memory includes two or more nonvolatile memory devices, and
    two or more nonvolatile memory devices are connected to the retiming circuit in common.

18. The storage device of claim 11, wherein the first timing signal is a read enable signal that is toggled by the memory controller at the read operation, and the second timing signal is a data strobe signal produced by the nonvolatile memory on the basis of the read enable signal.

\* \* \* \* \*